(12) United States Patent
Kawakami et al.

(10) Patent No.: US 7,261,956 B2
(45) Date of Patent: Aug. 28, 2007

(54) DECORATIVE ARTICLE AND TIMEPIECE

(75) Inventors: Atsushi Kawakami, Matsumoto (JP); Yoshiyuki Obi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 11/080,420

(22) Filed: Mar. 16, 2005

(65) Prior Publication Data

US 2005/0208325 A1    Sep. 22, 2005

(30) Foreign Application Priority Data

Mar. 16, 2004    (JP) .............................. 2004-075184

(51) Int. Cl.
*B32B 9/00* (2006.01)
(52) U.S. Cl. ...................... 428/698; 428/216; 428/336; 428/469; 428/699; 428/704
(58) Field of Classification Search .................. 428/698
See application file for complete search history.

(56) References Cited

U.S. PATENT DOCUMENTS

| 4,699,850 A | 10/1987 | Kishi et al. | |
|---|---|---|---|
| 4,791,017 A * | 12/1988 | Hofmann et al. ........... | 428/216 |
| 5,985,469 A * | 11/1999 | Kurakata et al. ........... | 428/627 |
| 2004/0237587 A1* | 12/2004 | Dubnicka ................... | 63/29.1 |

FOREIGN PATENT DOCUMENTS

| EP | 0621350 A | 10/1994 |
|---|---|---|
| EP | 0686706 A | 12/1995 |
| EP | 1286234 A | 2/2003 |
| JP | 59035676 A | 2/1984 |
| JP | 60056064 A | 4/1985 |
| JP | 62146255 A | 6/1987 |
| JP | 02166270 A | 6/1990 |
| JP | 0413860 A | 1/1992 |
| JP | 06025836 A | 2/1994 |
| JP | 06101018 * | 4/1994 |
| JP | 06346239 A | 12/1994 |
| JP | 2002206161 A | 7/2002 |
| WO | WO-9518248 A | 7/1995 |

\* cited by examiner

*Primary Examiner*—Jennifer McNeil
*Assistant Examiner*—Gordon R. Baldwin
(74) *Attorney, Agent, or Firm*—Global IP Counselors, LLP

(57) ABSTRACT

A decorative article 1A for a timepiece or the like is provided having a superior aesthetic appearance that can be maintained over a long period of time. The decorative article 1A has a substrate 2 wherein at least part of the surface vicinity is primarily configured from Ti and/or stainless steel, a first coat 3 formed on the substrate 2, and a second coat 4 formed on the first coat 3. The first coat 3 is configured primarily from TiCN, and the combined C content and N content in the first coat 3 is 5 to 30 wt %. The second coat 4 is configured primarily from M (where M is one or more elements selected from Ti, Pt, Pd, and In). The average thickness of the first coat 3 is 1.6 to 5 μm. The average thickness of the second coat 4 is 0.15 to 0.5 μm.

32 Claims, 10 Drawing Sheets

FIG. 6

Table 1

| | Base | Underlayer | | First Film Coating | | | Second Film Coating | |
|---|---|---|---|---|---|---|---|---|
| | Constituent Material | Constituent Material | Average Thickness [μm] | C Content [wt%] | N Content [wt%] | Average Thickness [μm] | Constituent Material | Average Thickness [μm] |
| Working Example 1 | SUS | — | — | 10.0 | 15.0 | 1.6 | TiCN(C:3.0wt%,N:5.5wt%) | 0.3 |
| Working Example 2 | SUS | — | — | 9.5 | 10.0 | 3.0 | TiCN(C:3.0wt%,N:5.5wt%) | 0.5 |
| Working Example 3 | SUS | — | — | 7.5 | 12.0 | 4.8 | TiCN(C:4.0wt%,N:4.5wt%) | 0.3 |
| Working Example 4 | SUS | — | — | 8.3 | 14.9 | 2.0 | TiCN(C:1.0wt%,N:1.5wt%) | 0.2 |
| Working Example 5 | SUS | — | — | 10.0 | 15.0 | 1.6 | Pt | 0.3 |
| Working Example 6 | SUS | — | — | 9.0 | 16.0 | 2.0 | Pt | 0.2 |
| Working Example 7 | SUS | — | — | 6.0 | 9.0 | 4.5 | Ti | 0.2 |
| Working Example 8 | SUS | — | — | 10.5 | 14.5 | 2.1 | Ti | 0.2 |
| Working Example 9 | SUS | — | — | 2.5 | 4.5 | 5.0 | Pd-In(Pd:99.0wt%,In1.0wt%) | 0.4 |
| Working Example 10 | SUS | — | — | 8.5 | 13.5 | 2.0 | Pd-In(Pd:97.0wt%,In3.0wt%) | 0.2 |
| Working Example 11 | Ti | — | — | 7.5 | 12.0 | 4.8 | TiCN(C:4.0wt%,N:4.5wt%) | 0.3 |
| Working Example 12 | Ti | — | — | 8.3 | 14.9 | 2.0 | TiCN(C:1.0wt%,N:1.5wt%) | 0.2 |
| Working Example 13 | Ti | — | — | 10.0 | 15.0 | 1.6 | Pt | 0.3 |
| Working Example 14 | Ti | — | — | 9.0 | 16.0 | 2.0 | Pt | 0.2 |
| Working Example 15 | Ti | — | — | 6.0 | 9.0 | 4.5 | Ti | 0.2 |
| Working Example 16 | Ti | — | — | 10.5 | 14.5 | 2.1 | Ti | 0.2 |
| Working Example 17 | Ti | — | — | 2.5 | 4.5 | 5.0 | Pd-In(Pd:99.0wt%,In1.0wt%) | 0.4 |
| Working Example 18 | Ti | — | — | 8.5 | 13.5 | 2.0 | Pd-In(Pd:97.0wt%,In3.0wt%) | 0.2 |

FIG. 7

Table 2

| | Base | Underlayer | | First Film Coating | | | Second Film Coating | |
|---|---|---|---|---|---|---|---|---|
| | Constituent Material | Constituent Material | Average Thickness [μm] | C Content [wt%] | N Content [wt%] | Average Thickness [μm] | Constituent Material | Average Thickness [μm] |
| Working Example 19 | SUS | Ti | 0.5 | 7.5 | 12.0 | 4.8 | TiCN(C:4.0wt%,N:4.5wt%) | 0.3 |
| Working Example 20 | SUS | Ti | 0.5 | 8.3 | 14.9 | 2.0 | TiCN(C:1.0wt%,N:1.5wt%) | 0.2 |
| Working Example 21 | SUS | Ti | 0.5 | 10.0 | 15.0 | 1.6 | Pt | 0.3 |
| Working Example 22 | SUS | Ti | 0.5 | 9.0 | 16.0 | 2.0 | Pt | 0.2 |
| Working Example 23 | SUS | Ti | 0.5 | 6.0 | 9.0 | 4.5 | Ti | 0.2 |
| Working Example 24 | SUS | Ti | 0.5 | 10.5 | 14.5 | 2.1 | Ti | 0.2 |
| Working Example 25 | SUS | Ti | 0.5 | 2.5 | 4.5 | 5.0 | Pd-In(Pd:99.0wt%,In1.0wt%) | 0.4 |
| Working Example 26 | SUS | Ti | 0.5 | 8.5 | 13.5 | 2.0 | Pd-In(Pd:97.0wt%,In3.0wt%) | 0.2 |
| Working Example 27 | Ti | Ti | 0.5 | 7.5 | 12.0 | 4.8 | TiCN(C:4.0wt%,N:4.5wt%) | 0.3 |
| Working Example 28 | Ti | Ti | 0.5 | 8.3 | 14.9 | 2.0 | TiCN(C:1.0wt%,N:1.5wt%) | 0.2 |
| Working Example 29 | Ti | Ti | 0.5 | 10.0 | 15.0 | 1.6 | Pt | 0.3 |
| Working Example 30 | Ti | Ti | 0.5 | 9.0 | 16.0 | 2.0 | Pt | 0.2 |
| Working Example 31 | Ti | Ti | 0.5 | 6.0 | 9.0 | 4.5 | Ti | 0.2 |
| Working Example 32 | Ti | Ti | 0.5 | 10.5 | 14.5 | 2.1 | Ti | 0.2 |
| Working Example 33 | Ti | Ti | 0.5 | 2.5 | 4.5 | 5.0 | Pd-In(Pd:99.0wt%,In1.0wt%) | 0.4 |
| Working Example 34 | Ti | Ti | 0.5 | 8.5 | 13.5 | 2.0 | Pd-In(Pd:97.0wt%,In3.0wt%) | 0.2 |

FIG. 8

Table 3

| | Base | Underlayer | | First Film Coating | | | | Second Film Coating | |
|---|---|---|---|---|---|---|---|---|---|
| | Constituent Material | Constituent Material | Average Thickness [μm] | C Content [wt%] | N Content [wt%] | Average Thickness [μm] | | Constituent Material | Average Thickness [μm] |
| Comparative Example 1 | Ti | – | – | 30 | – | 15 (TiC) | | Pt | 0.5 |
| Comparative Example 2 | Ti | – | – | – | 25 | 15 (TiN) | | Pt | 0.5 |
| Comparative Example 3 | SUS | – | – | – | – | 2.5 (Ti) | | – | – |
| Comparative Example 4 | SUS | – | – | – | – | 2.5 (Ti) | | Pt | 0.2 |
| Comparative Example 5 | SUS | – | – | 25.0 | 6.0 | 0.8 | | – | – |
| Comparative Example 6 | SUS | – | – | 25.0 | 6.0 | 0.8 | | Pt | 0.2 |
| Comparative Example 7 | SUS | – | – | 8.3 | 14.9 | 2 | | – | – |
| Comparative Example 8 | SUS | – | – | 11.1 | – | 2.0 (TiC) | | Pt | 0.2 |
| Comparative Example 9 | SUS | – | – | – | 16.7 | 2.0 (TiN) | | Pt | 0.2 |

FIG. 9

Table 4

| | Vickers Hardness | Appearance Evaluation | Abrasion Resistance | Scratching Resistance | Film Coating Re-forming |
|---|---|---|---|---|---|
| Working Example 1 | 700 | ◎ | ○ | ○ | ◎ |
| Working Example 2 | 900 | ○ | ◎ | ◎ | ◎ |
| Working Example 3 | 1000 | ○ | ◎ | ◎ | ◎ |
| Working Example 4 | 800 | ◎ | ◎ | ◎ | ◎ |
| Working Example 5 | 680 | ◎ | ○ | ○ | ◎ |
| Working Example 6 | 780 | ◎ | ◎ | ◎ | ◎ |
| Working Example 7 | 950 | ○ | ◎ | ◎ | ◎ |
| Working Example 8 | 780 | ◎ | ◎ | ◎ | ◎ |
| Working Example 9 | 940 | ○ | ◎ | ◎ | ◎ |
| Working Example 10 | 790 | ◎ | ◎ | ◎ | ◎ |
| Working Example 11 | 980 | ○ | ◎ | ◎ | ◎ |
| Working Example 12 | 780 | ◎ | ◎ | ◎ | ◎ |
| Working Example 13 | 660 | ◎ | ○ | ○ | ◎ |
| Working Example 14 | 760 | ◎ | ◎ | ◎ | ◎ |
| Working Example 15 | 930 | ○ | ◎ | ◎ | ◎ |
| Working Example 16 | 760 | ◎ | ◎ | ◎ | ◎ |
| Working Example 17 | 920 | ○ | ◎ | ◎ | ◎ |
| Working Example 18 | 770 | ◎ | ◎ | ◎ | ◎ |
| Working Example 19 | 1000 | ○ | ◎ | ◎ | ◎ |
| Working Example 20 | 850 | ◎ | ◎ | ◎ | ◎ |
| Working Example 21 | 730 | ◎ | ○ | ○ | ◎ |
| Working Example 22 | 830 | ◎ | ◎ | ◎ | ◎ |

FIG. 10

Table 5

| | Vickers Hardness | Appearance Evaluation | Abrasion Resistance | Scratching Resistance | Film Coating Re-forming |
|---|---|---|---|---|---|
| Working Example 23 | 980 | ○ | ◎ | ◎ | ◎ |
| Working Example 24 | 810 | ◎ | ◎ | ◎ | ◎ |
| Working Example 25 | 970 | ○ | ◎ | ◎ | ◎ |
| Working Example 26 | 820 | ◎ | ◎ | ◎ | ◎ |
| Working Example 27 | 1000 | ○ | ◎ | ◎ | ◎ |
| Working Example 28 | 810 | ◎ | ◎ | ◎ | ◎ |
| Working Example 29 | 690 | ◎ | ○ | ○ | ◎ |
| Working Example 30 | 790 | ◎ | ◎ | ◎ | ◎ |
| Working Example 31 | 960 | ○ | ◎ | ◎ | ◎ |
| Working Example 32 | 790 | ◎ | ◎ | ◎ | ◎ |
| Working Example 33 | 950 | ○ | ◎ | ◎ | ◎ |
| Working Example 34 | 800 | ◎ | ◎ | ◎ | ◎ |
| Comparative Example 1 | 1500 | X | ◎ | ◎ | X |
| Comparative Example 2 | 1500 | X | ◎ | ◎ | X |
| Comparative Example 3 | 350 | ◎ | X | X | X |
| Comparative Example 4 | 340 | ◎ | X | X | X |
| Comparative Example 5 | 400 | X | △ | X | △ |
| Comparative Example 6 | 390 | ◎ | △ | X | △ |
| Comparative Example 7 | 900 | X | ◎ | ◎ | ◎ |
| Comparative Example 8 | 950 | X | ◎ | ◎ | X |
| Comparative Example 9 | 900 | X | ◎ | ◎ | △ |

DECORATIVE ARTICLE AND TIMEPIECE

BACKGROUND OF THE INVENTION

1. Field of the Invention

The present invention generally relates to a decorative article. More specifically, the present invention relates to a decorative article and a timepiece.

2. Background Information

A superior aesthetic appearance is required for decorative articles such as exterior components for timepieces. Conventionally Pt, Ag, and other such metal materials have commonly been used as constituent materials for decorative articles to achieve such an objective. However, the hardness of these metal materials is usually relatively low, and decorative articles (particularly, exterior components and accessories for timepieces) configured from the aforementioned materials have had problems in that the surface is easily scratched and the aesthetic appearance is significantly degraded by long-term use.

In order to resolve such problems, a technique of nitriding the surface of a substrate composed, for example, of stainless steel or Ti with nitrogen has been used as a technique for hardening a substrate. An example is shown in Japanese Laid-Open Patent Application No. 11-318520, which is hereby incorporated herein by reference. However, nitriding treatment causes surface roughness, which changes the polished design. Mirror finished articles in particular are roughened and become clouded, and then cannot be used as decorative articles.

In view of this, a method of polishing the article to a mirror finish by mechanical polishing has been employed as a subsequent process. However, this method has had drawbacks in that hardness is reduced due to excessive scraping off of the hardened layer by polishing, and a layer with a subsequently unpolishable shape (a shape for which buffing is ineffective) cannot be treated.

In addition, a substrate that has been subjected to a nitriding treatment as described above has a low-quality color tone. Thus, it becomes difficult to apply the nitriding treatment to decorative articles wherein a superior design is required (particularly white and silver articles).

In view of the above, it will be apparent to those skilled in the art from this disclosure that there exists a need for an improved decorative article and timepiece. This invention addresses this need in the art as well as other needs, which will become apparent to those skilled in the art from this disclosure.

SUMMARY OF THE INVENTION

An object of the present invention is to provide a decorative article wherein a superior aesthetic appearance can be maintained over a long period of time, and to provide a timepiece having the decorative article. Such an object is achieved by the present invention as follows. A decorative article in accordance with a first aspect of the present invention has a substrate wherein at least part of the surface vicinity is primarily configured from Ti and/or stainless steel;
- a first coat is formed on the substrate and primarily configured from TiCN; and
- a second coat is formed on a side of the first coat opposite the side facing the substrate, and primarily configured from M (where M is one or more elements selected from Ti, Pt, Pd, and In);
- wherein the combined C content and N content in the first coat is 5 to 30 wt %.

It is thereby possible to provide a decorative article wherein a superior aesthetic appearance can be maintained over a long period of time.

A decorative article in accordance with a second aspect of the present invention has a substrate wherein at least part of the surface vicinity is primarily configured from Ti and/or stainless steel;
- a first coat is formed on the substrate and primarily configured from TiCN; and
- a second coat is formed on a side of the first coat opposite the side facing the substrate, and primarily configured from TiCN;
- wherein the combined C content and N content in the second coat is less than the combined C content and N content in the first coat; and
- the combined C content and N content in the first coat is 5 to 30 wt %.

It is thereby possible to provide a decorative article wherein a superior aesthetic appearance can be maintained over a long period of time.

A decorative article in accordance with a third aspect of the present invention is the article of the second aspect, wherein the combined C content and N content in the second coat is preferably 2 to 10 wt %. It is thereby possible to provide the decorative article with a particularly superior aesthetic appearance and to maintain the superior aesthetic appearance over a longer period of time.

A decorative article in accordance with a fourth aspect of the present invention is the article of any one of the first to third aspects, wherein the C content in the first coat is preferably 3 to 12 wt %. It is thereby possible to provide the decorative article with a particularly superior aesthetic appearance and to maintain the superior aesthetic appearance over a longer period of time.

A decorative article in accordance with a fifth aspect of the present invention is the article of any one of first to fourth aspects, wherein the N content in the first coat is preferably 2 to 18 wt %. It is thereby possible to provide the decorative article with a particularly superior aesthetic appearance and to maintain the superior aesthetic appearance over a longer period of time.

A decorative article in accordance with a sixth aspect of the present invention is the article of any one of the first to fifth aspects, wherein the C content in the first coat is preferably less than the N content in the first coat. It is thereby possible to provide the decorative article with a particularly superior aesthetic appearance.

A decorative article in accordance with a seventh aspect of the present invention is the article of any one of the first to sixth aspects, wherein the average thickness of the first coat is preferably 1.6 to 5 μm. It is thereby possible to prevent sufficiently an internal stress in the first coat from increasing, to ensure that the decorative article is not susceptible to cuts, scratches, and other such indentations or the like, and to maintain a superior aesthetic appearance over a longer period of time.

A decorative article in accordance with an eighth aspect of the present invention is the article of any one of the first to seventh aspects, wherein the average thickness of the second coat is preferably 0.15 to 0.5 μm. It is thereby possible to ensure that the decorative article has a sufficient hardness, to provide the decorative article with a particularly superior aesthetic appearance, and to maintain the superior aesthetic appearance over a longer period of time.

A decorative article in accordance with a ninth aspect of the present invention is the article of any one of the first to eighth aspects, wherein the first coat is preferably formed by a vapor phase film forming method. It is thereby possible to form reliably a first coat that has a uniform film thickness (little variation in film thickness) and that has particularly excellent adhesiveness with the substrate (including adhesiveness with the substrate through an underlayer). As a result, it is possible to provide the decorative article with a particularly superior aesthetic appearance and durability. This structure is also advantageous in terms of improving the reliability of the decorative article because variations in the film thickness can be sufficiently reduced even when the first coat to be formed is relatively thin.

A decorative article in accordance with a tenth aspect of the present invention is the article of the ninth aspect, wherein the vapor phase film forming method is preferably ion plating. It is thereby possible to form reliably a first coat that has a uniform film thickness (little variation in film thickness) and that has particularly excellent adhesiveness with the substrate (including adhesiveness with the substrate through an underlayer). As a result, it is possible to provide the decorative article with a particularly superior aesthetic appearance and durability. This is also advantageous in terms of improving the reliability of the decorative article because variations in the film thickness can be sufficiently reduced even when the first coat to be formed is relatively thin.

A decorative article in accordance with an eleventh aspect of the present invention is the article of any one of the first to tenth aspects, wherein the second coat is preferably formed by ion plating. It is thereby possible to provide the second coat with particularly superior adhesiveness. It is also possible to form easily a homogeneous second coat with a thickness that has little variation (particularly when the film thickness of the second coat is relatively low). Therefore, it is possible to provide the decorative article with a particularly superior aesthetic appearance and to maintain the superior aesthetic appearance over a longer period of time.

A decorative article in accordance with a twelfth aspect of the present invention is the article of any one of the first to eleventh aspects, wherein the article preferably has at least one underlayer between the substrate and the first coat. Thus, for example, it is thereby possible to improve the adhesiveness between the substrate and the first coat, and to ensure that the decorative article has superior reliability and durability.

A decorative article in accordance with a thirteenth aspect of the present invention is the article of the twelfth aspect, wherein the article preferably has a layer configured primarily from Ti as the underlayer. Thus, for example, it is thus possible to improve further the adhesiveness between the substrate and the first coat, and to ensure that the decorative article has particularly superior reliability and durability.

A decorative article in accordance with a fourteenth aspect of the present invention is the article of the twelfth or thirteenth aspect, wherein the average thickness of the underlayer is preferably 0.1 to 2.0 µm. For example, it is thus possible to prevent sufficiently internal stress in the underlayer from increasing and cracks and the like from occurring, and to further improve the adhesiveness between the substrate and the first coat.

A decorative article in accordance with a fifteenth aspect of the present invention is the article of any one of the first to fourteenth aspects, wherein the Vickers hardness Hv measured at a load of 10 gf is preferably 600 to 1000 on the surface of the side to which the second coat is provided. It is thereby possible to maintain a superior aesthetic appearance in the decorative article over a longer period of time.

A decorative article in accordance with a sixteenth aspect of the present invention is the article of any one of the first to fifteenth aspects, wherein the article is preferably an exterior component for a timepiece. Exterior components for timepieces are commonly decorative articles that are susceptible to impact from external sources, and these components must have an aesthetic appearance as decorative articles, and durability as practical articles. With the present invention, these requirements can be simultaneously satisfied.

A timepiece in accordance with a seventeenth aspect of the present invention includes the decorative article any of the aforementioned aspects of the present invention. It is thereby possible to provide a timepiece wherein a superior aesthetic appearance can be maintained over a long period of time.

According to the present invention, it is possible to provide a decorative article wherein a superior aesthetic appearance can be maintained over a long period of time, and to provide a timepiece including this decorative article.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 6 is a view of a first table illustrating results of working and comparative examples of the present invention;

FIG. 7 is a view of a second table further illustrating results of working and comparative examples of the present invention;

FIG. 8 is a view of a third table further illustrating even further results of working and comparative examples of the present invention;

FIG. 9 is a view of a fourth table further illustrating results of working and comparative examples of the present invention having articles with coats removed and formed again; and FIG. 10 is a view of a fifth table further illustrating results of working and comparative examples of the present invention having articles with coats removed and formed again.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

The preferred embodiments of the decorative article and timepiece of the present invention will now be described with reference to the accompanying diagrams.

First, the first embodiment of the decorative article of the present invention and the preferred embodiment of the manufacturing method thereof will be described.

Figure 1:
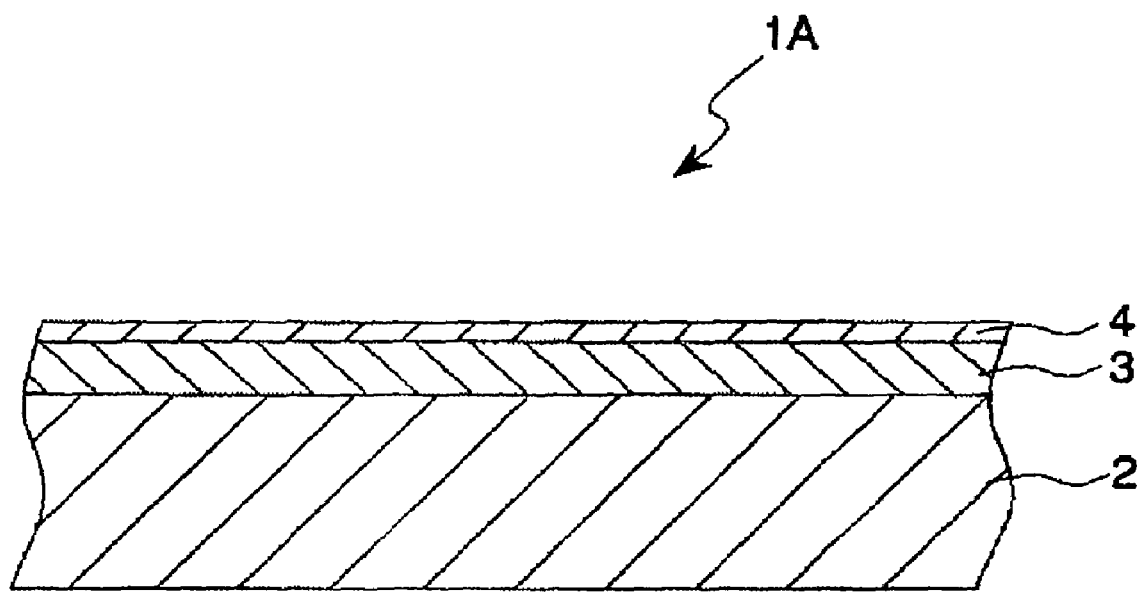
FIG. 1 is a cross-sectional view illustrating a decorative article in accordance with a first preferred embodiment of the present invention.
Figure 2:
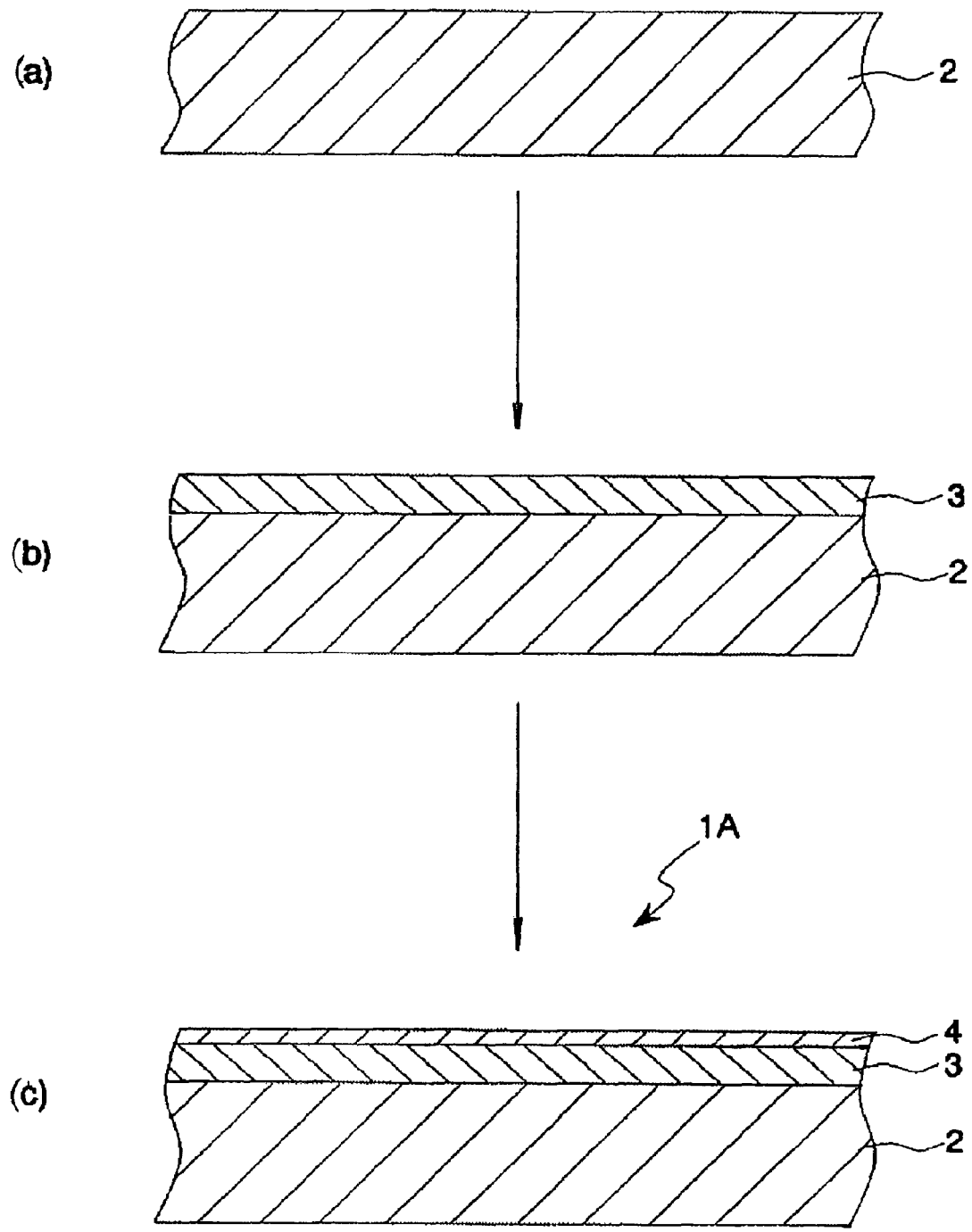
FIG. 2 is a cross-sectional view illustrating a method for manufacturing the decorative article shown in FIG. 1.

FIG. 1 is a cross-sectional view showing a decorative article in accordance with a first preferred embodiment of the present invention, and FIG. 2 is a cross-sectional view showing a method for manufacturing the decorative article shown in FIG. 1. As shown in FIG. 1, the decorative article 1A of the present embodiment has a substrate 2, a first coat 3, and a second coat 4.

Substrate

In the substrate (metal material) 2, at least part of the surface vicinity is primarily configured from Ti and/or stainless steel. Possible examples of materials configured primarily from Ti include Ti (Ti as an elementary substance), a Ti alloy, and the like. Furthermore, possible examples of stainless steel include a Fe—Cr based alloy, a Fe—Cr—Ni based alloy, or the like, or, more specifically, SUS 405, SUS 430, SUS 434, SUS 444, SUS 429, SUS 430F and the like, as well as SUS 304, SUS 303, SUS 316, SUS 316 L, SUS 316 J1, SUS 316 J1L, and the like. Possible examples of materials that can be subjected to nitriding treatment or carburizing treatment include materials other than the materials configured by Ti and/or stainless steel as described above, but when such a material is used (a material configured primarily from Ti and/or stainless steel), it is difficult to increase sufficiently the hardness of the finally resulting decorative article. In addition, when a material configured primarily from Ti and/or stainless steel is not used, it is difficult to maintain sufficiently a superior aesthetic appearance (particularly an aesthetic appearance required in an exterior component for a timepiece or another such decorative article) over a long period of time in the finally resulting decorative article.

The substrate 2 may have a substantially uniform composition in every section, and may also have a composition that differs from section to section. For example, the substrate 2 may have a substrate, and a surface layer formed on top of the substrate. When the substrate 2 has such a configuration, the degree of freedom in molding the substrate 2 can be increased depending, for example, on the selection of the constituent material for the substrate, and a decorative article 1A with a more complicated shape can be relatively easily manufactured. If the substrate 2 has a base and a surface layer, the thickness of the surface layer (average value) is not particularly limited, but is preferably 0.1 to 50 μm, and is more preferably 1.0 to 10 μm. If the thickness of the surface layer is within this range, the substrate 2 can be provided with particularly superior strength after undergoing a hardening treatment, and the surface layer can be more reliably prevented from accidentally peeling off of the substrate.

When the substrate 2 has a base and a surface layer, the materials previously described, for example, can be suitably used as the constituent materials of the surface layer. Metal materials, nonmetal materials, and the like, for example, can be used as the constituent materials of the substrate.

When the substrate is configured from a metal material, it is possible to provide a decorative article 1A having particularly superior strength characteristics. In addition, when the substrate is configured from a metal material, the surface roughness of the resulting decorative article 1A can be reduced due to the leveling effects when the first coat 3 and the second coat 4 described later are formed, even when the surface roughness of the substrate is relatively high. For example, it is possible to provide a mirror finish even if machining based on cutting, polishing, or the like and performed on the surface of the substrate is omitted. Since the substrate is molded by MIM methods, a mirror finish can be easily created even when the surface has a satin finish. Thus, a decorative article with excellent luster can be provided.

When the substrate is configured, for example, from a nonmetal material, a decorative article 1A can be provided that is relatively lightweight and easily portable and that has a substantive appearance. In addition, when the substrate is configured, for example, from a nonmetal material, it can be formed into the desired shape relatively easily. Furthermore, when the substrate is configured from a nonmetal material, the effects of blocking electromagnetic noise are realized.

Possible examples of the metal material constituting the substrate include Fe, Cu, Zn, Ni, Ti, Mg, Cr, Mn, Mo, Nb, Al, V, Zr, Sn, Au, Pd, Pt, Ag, and other such various metals, as well as alloys and other materials containing at least one of these metals. Of these examples, Cu, Zn, Ni, Ti, Al, or an alloy containing at least one of these metals are preferred. Configuring the substrate with such materials makes it possible to ensure particularly superior adhesiveness between the substrate and the surface layer, improves the workability of the substrate, and further increases the degree of freedom in molding the entire substrate 2.

Further, possible examples of the nonmetal material constituting the substrate include ceramics, plastic (particularly heat-resistant plastic), stone, wood, and the like. Possible examples of suitable ceramics include $Al_2O_3$, $SiO_2$, $TiO_2$, $Ti_2O_3$, $ZrO_2$, $Y_2O_3$, barium titanate, strontium titanate, and other such oxide-based ceramics; AlN, $Si_3N_4$, SiN, TiN, BN, ZrN, HfN, VN, TaN, NbN, CrN, $Cr_2N$, and other such nitride-based ceramics; graphite, SiC, ZrC, $Al_4C_3$, $CaC_2$, WC, TiC, HfC, VC, TaC, NbC, and other such carbide-based ceramics; $ZrB_2$, MoB, and other such boride-based ceramics; and compound ceramics made of a combination of two or more of these examples. When the substrate is configured from such ceramics, a decorative article 1A having particularly superior strength and hardness can be obtained.

Possible examples of the plastic material constituting the substrate include various thermoplastic resins and various thermosetting resins; for example, polyethylene, polypropylene, ethylene-propylene copolymers, ethylene-vinyl acetate copolymers (EVA), other polyolefins, cyclic polyolefins, modified polyolefins, polyvinyl chloride, polyvinylidene chloride, polystyrene, polyamide (examples: nylon 6, nylon 46, nylon 66, nylon 610, nylon 612, nylon 11, nylon 12, nylon 6-12, nylon 6-66), polyimide, polyamide imide, polycarbonate (PC), poly(4-methylbentene-1), ionomers, acrylic resins, polymethyl methacrylate, acrylonitrile-butadiene-styrene copolymers (ABS resins), acrylonitrile-styrene copolymers (AS resins), butadiene-styrene copolymers, polyoxymethylene, polyvinyl alcohols (PVA), ethylene-vinyl alcohol copolymers (EVOH), polyethylene terephthalate (PET), polybutylene terephthalate (PBT), polycyclohexane terephthalate (PCT), other polyesters, polyether, polyether ketone (PEK), polyether ether ketone (PEEK), polyether imide, polyacetal (POM), polyphenylene oxide, modified polyphenylene oxide, polysulfone, polyether sulfone, polyphenylene sulfide, polyarylate, aromatic polyesters (liquid crystal polymers), polytetrafluoroethylene, polyvinylidene fluoride, other fluororesins, and various thermoplastic elastomers based on styrene, polyolefin, polyvinyl chloride, polyurethane, polyester, polyamide, polybutadiene, transpolyisoprene, fluoride rubber, polyethylene chloride, or the like, as well as epoxy resins, phenol resins, urea resins, melamine resins, unsaturated polyesters, silicone-based resins, urethane-based resins, poly-para-xylylene, poly-monochloro-para-xylylene, poly-dichloro-para-xylylene, poly-monofluoro-para-xylylene, poly-monoethyl-para-xylylene, and other such poly-para-xylylene resins. Additional examples include copolymers, blends, and polymer alloys primarily made of these; and combinations (for example, blended resins, polymer alloys, layered products, and the like) of one or two or more of these examples can be used.

Further, the shape and size of the substrate 2 are not particularly limited, and are normally determined based on the shape and size of the decorative article 1A.

First Coat

The first coat 3 is formed on the surface of the substrate 2. The first coat 3 is configured primarily from TiCN. The combined C content and N content in the first coat 3 is preferably 5 to 30 wt %.

The presence of the first coat 3 makes it possible to provide the entire decorative article 1A with superior hardness (hardness on the surface to which the first coat 3 and second coat 4 are provided; similar hereinbelow), and to ensure that the decorative article 1A is not susceptible to cuts, scratches, and other such indentations or the like. Further, the presence of the first coat 3 makes it possible to provide the entire decorative article 1A with a superior aesthetic appearance even when the film thickness of the second coat 4 described later is relatively low. Specifically, the color tone of the first coat 3 has a strong effect on the aesthetic appearance of the decorative article 1A when the film thickness of the second coat 4 described later is relatively low. However, since the color tone (chromaticity) of the TiCN (first coat 3) described above is relatively similar to the color tone (chromaticity) of the second coat 4, the difference is small. The entire decorative article 1A can be provided with a superior aesthetic appearance even in such a case. In addition, the adverse effects on the aesthetic appearance of the decorative article 1A can be minimized even when the second coat 4 is rubbed or stripped off due to extensive use of the decorative article 1A, for example. Accordingly, the hardness of the entire decorative article cannot be sufficiently increased when the decorative article does not have a first coat configured from TiCN. As a result, the decorative article is susceptible to cuts, scratches, and other such indentations or the like. Further, the effect of the color tone of the substrate and the like on the design of the decorative article increases when the decorative article does not have a first coat configured from TiCN. Therefore, sometimes the aesthetic appearance of the decorative article is significantly compromised, depending on the combination of the constituent material of the substrate, the constituent material of the second coat, and the like. Moreover, the hardness of the entire decorative article cannot be sufficiently increased when the combined C content and N content in the first coat is less than the aforementioned lower limit. As a result, the decorative article is susceptible to cuts, scratches, and other such indentations or the like. Also, when the combined C content and N content in the first coat exceeds the aforementioned upper limit, the internal stress of the coating film becomes too great and cracks and the like are likely to occur, depending on the thickness and the like of the first coat. Therefore, the reliability of the decorative article is significantly reduced. Furthermore, when the combined C content and N content in the first coat exceeds the aforementioned upper limit, the difference in color tone (chromaticity) with the second coat becomes too great and the aesthetic appearance of the entire decorative article is reduced.

As described above, the sum ($X_1$) of the C content ($X_{1C}$) and the N content ($X_{1N}$) in the first coat 3 is 5 to 30 wt %, but 10 to 28 wt % is preferable, and 15 to 25 wt % is even more preferable. Thus, in the present invention, the combined C content and N content in the first coat is preferably relatively low. The effects previously described are thereby more pronounced as a result.

Furthermore, the C content ($X_{1C}$) in the first coat 3 is preferably 3 to 12 wt %, and is more preferably 5 to 9 wt %. If the C content in the first coat 3 is a value within this range, the decorative article 1A is ensured to have sufficient hardness, and the color tone (chromaticity) of the first coat 3 can be optimized. As a result, the above-described effects of the present invention are more significantly exhibited. Accordingly, if the C content in the first coat 3 is less than the aforementioned lower limit, it may be difficult to ensure a sufficient hardness for the decorative article 1A, depending on the N content and the like in the first coat 3. If the C content in the first coat 3 exceeds the aforementioned upper limit, the color tone of the first coat 3 becomes too strong (too black), which may possibly have adverse effects on the aesthetic appearance of the decorative article 1A, depending on the thickness and the like of the second coat 4.

In addition, the N content ($X_{1N}$) in the first coat 3 is preferably 2 to 18 wt %, and is more preferably 8 to 16 wt %. If the N content in the first coat 3 is a value within this range, the decorative article 1A is ensured to have sufficient hardness, and the color tone (chromaticity) of the first coat 3 can be optimized. As a result, the above-described effects of the present invention are more significantly exhibited. Accordingly, if the N content in the first coat 3 is less than the aforementioned lower limit, it may be difficult to ensure sufficient hardness for the decorative article 1A, depending on the C content and the like in the first coat 3. If the N content in the first coat 3 exceeds the aforementioned upper limit, the color tone of the first coat 3 becomes too strong (too gold), which may possibly have adverse effects on the aesthetic appearance of the decorative article 1A, depending on the thickness and the like of the second coat 4.

Further, the C content $X_{1C}$ (wt %) in the first coat 3 is preferably less than the N content $X_{1N}$ (wt %) in the first coat 3. The color tone of the first coat 3 can thereby be prevented from becoming too black. Thus, as a result, the decorative article 1A can be provided with a particularly superior aesthetic appearance (particularly when the thickness of the second coat 4 is relatively low).

Further, the C content $X_{1C}$ (wt %) in the first coat 3 and the N content $X_{1N}$ (wt %) in the first coat 3 preferably satisfy the relationship $1 \leq X_{1N} - X_{1C} \leq 10$, and more preferably satisfy the relationship $2 \leq X_{1N} - X_{1C} \leq 9$, and even more preferably satisfy the relationship $3 \leq X_{1N} - X_{1C} \leq 8$. If such a relationship is satisfied, the color tone of the first coat 3 can thereby be prevented from becoming too black, and the decorative article 1A can be ensured to have a sufficient hardness. As a result, a superior aesthetic appearance can be maintained in the decorative article 1A over a longer period of time.

As described above, in the present invention, the first coat is configured primarily from TiCN. TiC and TiN are both materials whose hardness is similar to that of TiCN. However, the effects of the present invention cannot be realized when the first coat is composed of TiC or TiN. Specifically, when the first coat is composed of TiC, the color tone of the first coat becomes too black, and the aesthetic appearance of the entire decorative article is significantly compromised. Also, if the C content in the first coat (TiC coat) is reduced to prevent this, a sufficient hardness cannot be ensured for the entire decorative article, and the decorative article is susceptible to cuts, scratches, and other such indentations and the like. Similarly, when the first coat is composed of TiN, the color tone of the first coat becomes too gold, and the aesthetic appearance of the entire decorative article is compromised. Further, if the N content in the first coat (TiN coat) is reduced to prevent this adverse event from occurring, a sufficient hardness cannot be ensured for the entire decorative article, and the decorative article is susceptible to cuts, scratches, and other such indentations and the like.

If the first coat 3 is configured from TiCN as described above (TiCN in which the combined C content and N content is within a specific range), the decorative article 1A is sufficiently stable under normal usage conditions (for example, a temperature of −50 to 120° C. and a humidity of 0 to 100% RH), the substrate 2 does not suffer substantial scratches, and the first coat 3 can be easily and reliably removed using special reagents. Therefore, when stains occur in the first coat 3 of the decorative article 1A, the first coat 3 can be removed and another first coat 3 can be suitably formed. Thus, in the decorative article of the present invention, the coat (first coat) can be easily and reliably stripped and re-formed by using special reagents, and the characteristics thereof can therefore continue to be exhibited over an extremely long period of time. A possible example of a stripping agent that can be used to strip the first coat 3 is a solution or the like containing nitric acid ($HNO_3$) and sulfuric acid ($H_2SO_4$). When the stripping agent is such a solution, the concentration of nitric acid ($HNO_3$) in the solution is preferably about 10 to 30 vol %, and the concentration of sulfuric acid ($H_2SO_4$) is preferably about 10 to 30 vol %. Thus, the first coat 3 can be easily and reliably removed in a relatively short period of time without inflicting substantial damage to the substrate 2 or the like. Accordingly, it is difficult or practically impossible to strip the coat with a coat configured from TiN or TiC or a TiCN coat in which the combined C content and N content is outside of the aforementioned range, even with the use of such reagents as described above.

Further, the average thickness of the first coat 3 is not particularly limited, but is preferably 1.6 to 5 μm, and is more preferably 2.0 to 4.0 μm. If the average thickness of the first coat 3 is a value within this range, the first coat 3 can be ensured to have a sufficient hardness and the internal stress of the first coat 3 can be more effectively prevented from increasing. As a result, the decorative article 1A can be ensured to have particularly superior reliability and durability. Accordingly, if the average thickness of the first coat 3 is less than the aforementioned lower limit, the functions of the first coat 3 as described above may possibly not be sufficiently exhibited, depending on the C content ($X_{1C}$), N content ($X_{1N}$), and the like in the first coat 3. Also, if the average thickness of the first coat 3 exceeds the aforementioned upper limit, the internal stress of the first coat 3 exhibits a tendency to increase, depending on the C content ($X_{1C}$), the N content ($X_{1N}$), and the like in the first coat 3.

Furthermore, the first coat 3 may have a plurality of sections where the values for the combined C content and N content (or the values for the C content and the values for the N content) differ. For example, the first coat 3 may have a first section in which the combined C content and N content is a specific value X, and a second section in which the combined C content and N content is a specific value X' that is greater than X. In such a case, for example, providing the first section nearer to the substrate 2 than the second section makes it possible to further increase the hardness of the first coat 3 while more effectively preventing the internal stress of the first coat 3 from increasing, and to ensure particularly superior adhesiveness between the substrate 2 and the first coat 3. Therefore, it is possible for the decorative article 1A to maintain a superior aesthetic appearance in a stable manner over a longer period of time. Moreover, the following effects are achieved when the second section is provided nearer to the substrate 2 than the first section. As a result of having a second section in which the combined C content and N content is relatively large, the entire first coat 3 can be ensured to have particularly superior hardness (hardness of the entire decorative article 1A), and it is possible to reduce the effects of the second section having a relatively strong color tone on the aesthetic appearance of the decorative article 1A. Specifically, having the first section nearer to the second coat 4 (the external surface of the decorative article) than the second section makes the design of the decorative article 1A more susceptible to the effects of the color tone of the first section than the effects of the color tone of the second section. Therefore, the entire first coat 3 can be ensured to have a particularly superior hardness (hardness of the entire decorative article 1A), and the entire decorative article 1A can be ensured to have a particularly superior aesthetic appearance. Accordingly, it is possible for the decorative article 1A to maintain a superior aesthetic appearance in a stable manner over a longer period of time. Furthermore, when the first coat 3 has a plurality of sections with different compositions (for example, when it has a first section and second section as described above), the first coat 3 may, for example, be configured with a layered structure including a plurality of layers with different compositions, or the composition may have a gradient along the thickness direction.

Second Coat

The second coat 4 is formed on the surface of the first coat 3 (the surface opposite the surface facing the substrate 2). The second coat 4 is configured either primarily from M (where M is one or more elements selected from Ti, Pt, Pd, and In), or primarily from TiCN (TiCN wherein the combined C content and N content is less than that of the TiCN constituting the above-described first coat 3). The term "primarily" herein denotes that the content is the greatest of all the constituent materials (constituent components) of the second coat 4, and it is preferable that the content be 50 wt % or more of all the constituent materials (constituent components), more preferable 90 wt % or more, and even more preferable 99 wt % or more.

As a result of having such a second coat 4, the entire decorative article 1A has a superior aesthetic appearance, and particularly has a sophisticated white or silver color tone. The color tone of the above-described first coat 3 is relatively similar to the color tone of the second coat 4, but without the second coat 4, the aesthetic appearance of the entire decorative article 1A is insufficient. More specifically, the decorative article 1A lacks sophistication without the second coat 4.

The average thickness of the second coat 4 is not particularly limited, but is preferably 0.15 to 0.5 μm, and is more preferably 0.15 to 0.3 μm. If the average thickness of the second coat 4 is a value within this range, the entire decorative article 1A can be provided with a particularly superior aesthetic appearance, and the entire decorative article 1A can be ensured to have a particularly high hardness. As a result, it is possible for the decorative article 1A to maintain a superior aesthetic appearance in a stable manner over a longer period of time. Accordingly, if the average thickness of the second coat 4 is less than the aforementioned lower limit, it may possibly be difficult to ensure a sufficiently superior design for the decorative article 1A, depending on the composition and the like of the first coat 3 (for example, the C content and N content). Further, if the average thickness of the second coat 4 exceeds the aforementioned upper limit, it is difficult for the effects of having the first coat previously described to be sufficiently manifest, and the hardness of the decorative article 1A exhibits a tendency to decrease.

The second coat 4 may also be configured from a material containing both the aforementioned M and TiCN (wherein the combined C content and N content is less than that of the TiCN constituting the above-described first coat 3).

The second coat 4 may also have a plurality of sections with different compositions. For example, the second coat 4 may have a first section configured primarily from M, and a second section configured primarily from TiCN (wherein the combined C content and N content is less than that of the TiCN constituting the above-described first coat 3). The second coat may also, for example, be configured from a layered structure including a plurality of layers with different compositions, or the composition may have a gradient along the thickness direction.

Case Wherein the Second Coat is Configured Primarily from TiCN

When the second coat 4 is configured primarily from TiCN, the entire decorative article 1A can be ensured to have even more hardness. Therefore, it is possible for the decorative article 1A to maintain a superior aesthetic appearance in a stable manner over a longer period of time. When the second coat 4 is configured primarily from TiCN, the following conditions are preferably satisfied. The sum ($X_2$) of the C content and the N content in the second coat 4 is less than the sum ($X_1$) of the C content and the N content in the first coat 3. In this case, the sum ($X_2$) of the C content ($X_{2C}$) and the N content ($X_{2N}$) in the second coat 4 is preferably 2 to 10 wt %, more preferably 2 to 8 wt %, and even more preferably 2 to 6 wt %. If the sum ($X_2$) of the C content ($X_{2C}$) and the N content ($X_{2N}$) in the second coat 4 is a value within this range, the decorative article 1A has a more sophisticated white or silver color tone as a result.

Further, the C content ($X_{2C}$) in the second coat 4 is preferably 0.5 to 4 wt %, and is more preferably 1 to 4 wt %. If the C content in the second coat 4 is a value within this range, the decorative article 1A can be ensured to have a particularly high hardness, and the color tone (chromaticity) of the second coat 4 can be optimized.

The N content ($X_{2N}$) in the second coat 4 is preferably 0.5 to 6 wt %, and is more preferably 1 to 5 wt %. If the N content in the second coat 4 is within this range, the decorative article 1A can be ensured to have a sufficiently high hardness, and the color tone (chromaticity) of the second coat 4 can be optimized.

Further, when $X_1$ (wt %) denotes the combined C content ($X_{1C}$) and the N content ($X_{1N}$) in the first coat 3, and $X_2$ (wt %) denotes the combined C content ($X_{2C}$) and the N content ($X_{2N}$) in the second coat 4, it is preferable to satisfy the relationship $3 \leq X_1 - X_2 \leq 28$, more preferable to satisfy the relationship $8 \leq X_1 - X_2 \leq 28$, and even more preferable to satisfy the relationship $15 \leq X_1 - X_2 \leq 28$. If such a relationship is satisfied, the entire decorative article 1A can be ensured to have a even greater hardness, and particularly superior adhesiveness can be ensured between the first coat 3 and the second coat 4. Therefore, it is possible for the decorative article 1A to maintain a superior aesthetic appearance in a stable manner over a longer period of time.

Decorative Article

The decorative article 1A described above may be any product that has decorative properties, and possible examples of items to which it can be applied include interior and exterior accessories for ornaments and the like, jewelry, timepiece cases (main bodies, back covers, and one-piece cases with the main body and back cover integrated), timepiece bands (including band buckles, band/bangle detachable mechanisms, and the like), dial plates, timepiece pointers, bezels (for example, rotating bezels and the like), winders (for example, screw-lock winders and the like), buttons, cover glass, glass rims, dial rings, see-through plates, gaskets, and other such external timepiece components; substrate plates for movements, gears, train wheel bridges, oscillating weights, and other such internal timepiece components; and eyeglasses (for example, eyeglass frames), necktie pins, cuff links, rings, necklaces, bracelets, anklets, brooches, pendants, earrings, pierced earrings, and other such personal accessories, as well as lighters and cases thereof, wheels for automobiles, golf clubs and other such sports equipment, nameplates, panels, trophies, various machinery accessories including other housings and the like, and various containers. Among these examples, external timepiece components are the most preferred. External timepiece components require aestheticism in design as decorative articles, and also require durability, corrosion resistance, scratching resistance, abrasion resistance, and a superior design as practical articles, but all these requirements can be met according to the present invention. The term "external timepiece components" in the present specification may denote any components that are visible from the outside, but is not limited to those exposed on the exterior of the timepiece and includes those installed in the interior of the timepiece.

Further, in the decorative article of the present invention, the Vickers hardness Hv measured at a load of 10 gf is preferably 600 to 1000 on the surface of the side on which the second coat is provided. It is thereby possible to maintain a superior aesthetic appearance in the decorative article over a longer period of time.

Next, the method for manufacturing the decorative article 1A described above will be described.

FIG. 2 is a cross-sectional view showing a method for manufacturing the decorative article shown in FIG. 1 in accordance with the first embodiment of the present invention. As shown in FIG. 2, the method for manufacturing the decorative article of the present embodiment has a first step (b) of forming the first coat 3 on at least part of the surface of the substrate 2 (a), and a second step (c) of forming the second coat 4 on at least part of the surface of the first coat 3.

Substrate

The components previously described can be used for the substrate 2.

The substrate 2 may be molded by any suitable method. Possible examples of methods for molding the substrate 2 include pressing, cutting, forging, casting, metal powder sintering, metal powder injection molding (MIM), lost-wax processing, and the like.

When the substrate 2 has a base portion and a surface layer as previously described, the substrate 2 can be manufactured as follows. Specifically, the substrate 2 can be obtained by forming a surface layer on the substrate portion manufactured by a method such as one previously described. Possible examples of the method for forming the surface layer include: dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods; thermal spraying; and the like.

Further, the surface of the substrate 2 may be mirror finished, creased, satinized, or otherwise surface treated. It is thereby possible to have variation in the glossy appearance in the surface of the resulting decorative article 1A, and the decorative properties of the resulting decorative article 1A can be further improved. Mirror finishing, for example, can be performed using conventional polishing methods, for which buffer (cloth) polishing, barrel polishing, and other mechanical polishing methods can be employed.

A decorative article 1A manufactured with the use of a substrate 2 subjected to such surface treatment is less flashy and has a particularly superior aesthetic appearance compared to one obtained by directly subjecting the first coat 3 and second coat 4 to the aforementioned surface processing. Further, since the first coat 3 is configured from the hard material of TiCN as previously described, when the first coat 3 is directly subjected to surface processing, the first coat 3 is susceptible to cracks and other such blemishes when undergoing the surface processing, and the yield rate of manufacturing the decorative article 1A may significantly decrease, but subjecting the substrate 2 to surface treatment makes it possible to prevent effectively such problems. Moreover, the surface treatment for the substrate 2 can be more easily performed under mild conditions than the surface processing for the first coat 3. In addition, since the second coat 4 normally has a relatively low thickness, when the surface processing described above is performed after the second coat 4 is formed, the film thickness of the second coat in the subjected areas is markedly reduced, and the first coat may possibly be exposed. In such a case, the aesthetic appearance of the decorative article 1A is severely compromised as a result.

First Step (First Coat Formation Step)

A first coat 3 configured from TiCN is formed on the surface of the substrate 2 as shown in Line (b) of FIG. 2. The method for forming the first coat 3 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like. However, a dry plating method (vapor phase film forming method) is preferred. Applying a dry plating method (vapor phase film forming method) as the method for forming the first coat 3 makes it possible to form reliably a first coat 3 that has uniform thickness, is homogeneous, and has particularly superior adhesiveness with the substrate 2. As a result, the finally resulting decorative article 1A can be ensured to have a particularly superior aesthetic appearance and durability. Applying a dry plating method (vapor phase film forming method) as the method for forming the first coat 3 also makes it possible to ensure that variation in the film thickness will be sufficiently low even if the first coat 3 to be formed is relatively thin. This is advantageous in terms of improving the reliability of the decorative article 1A. Applying a dry plating method (vapor phase film forming method) as the method for forming the first coat 3 also makes it possible to control more reliably the C content and N content in the first coat 3.

Among the dry plating methods (vapor phase film forming methods) described above, ion plating is particularly preferred. If ion plating is applied as the method for forming the first coat 3, the desired effects described above are more pronounced as a result. Specifically, applying ion plating as the method for forming the first coat 3 makes it possible to form more reliably a first coat 3 that has uniform thickness, is homogeneous, and has particularly superior adhesiveness with the substrate 2. As a result, the finally resulting decorative article 1A can be ensured to have a more superior aesthetic appearance and durability. Applying ion plating as the method for forming the first coat 3 also makes it possible to ensure that variation in the film thickness will be sufficiently low even if the first coat 3 to be formed is relatively thin. Applying ion plating as the method for forming the first coat 3 also makes it possible to control more reliably the C content and N content in the first coat 3.

When a dry plating method such as those described above is applied, for example, the first coat 3 can be easily and reliably formed by using Ti as a target and treating the film in an atmosphere containing C (carbon) and N (nitrogen). A mixed gas containing nitrogen gas ($N_2$ gas) and acetylene or another such hydrocarbon gas, for example, can be used as the atmospheric gas. The composition (C and N content) and the like of the first coat 3 to be formed can be adjusted by suitably adjusting the blend ratio and the like of these gases.

The atmospheric gas may contain argon gas or another such inert gas, for example. Thus, the C content and N content in the first coat 3 can be easily and reliably controlled to be relatively low. The atmospheric gas may also contain oxygen gas ($O_2$) or the like, for example. Thus, a first coat 3 whose composition contains oxygen (TiCNO) can be easily and reliably formed.

Second Step (Second Coat Formation Step)

Next, the second coat 4 is formed on the surface of the first coat 3 formed as described above as seen in line (c) of FIG. 2.

The method for forming the second coat 4 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like, but a dry plating method (vapor phase film forming method) is preferred. Applying a dry plating method (vapor phase film forming method) as the method for forming the second coat 4 makes it possible to form reliably a second coat 4 that has uniform thickness, is homogeneous, and has particularly superior adhesiveness with the first coat 3. As a result, the finally resulting decorative article 1A can be ensured to have a particularly superior aesthetic appearance and durability. Applying a dry plating method (vapor phase film forming method) as the method for forming the second coat 4 also makes it possible to ensure that variation in the film thickness will be sufficiently low even if the second coat 4 to be formed is relatively thin. This is advantageous in terms of improving the reliability of the decorative article 1A. Applying a dry plating method (vapor phase film forming method) as the method for forming the second coat 4 also makes it possible to control more reliably the C content and N content in the second coat 4.

Among the dry plating methods (vapor phase film forming methods) described above, ion plating is particularly preferred. If ion plating is applied as the method for forming the second coat 4, the effects described above are more pronounced as a result. Specifically, applying ion plating as the method for forming the second coat 4 makes it possible to form more reliably a second coat 4 that has uniform thickness, is homogeneous, and has particularly superior adhesiveness with the first coat 3. As a result, the finally resulting decorative article 1A can be ensured to have a more superior aesthetic appearance and durability. Applying ion plating as the method for forming the second coat 4 also makes it possible to ensure that variation in the film thickness will be sufficiently low even if the second coat 4 to be formed is relatively thin, which is advantageous in terms of improving the reliability of the decorative article 1A. Applying a dry plating method (vapor phase film forming method) as the method for forming the FIG. 4 also makes it possible to control more reliably the C content and N content in the second coat 4 when the second coat 4 is configured primarily from TiCN.

When the first step described above is performed with a dry plating method such as those described above, for example, the first step and the second step can be performed successively (without removing the substrate 2 from the apparatus) in the same apparatus by varying the type of the target and the composition of the atmospheric gas (for example, the blend ratio between Ar gas or another such inert gas as well as nitrogen gas and a hydrocarbon gas) in the vapor phase film forming apparatus (in the chamber). This results in particularly superior adhesiveness between the substrate 2, the first coat 3, and the second coat 4, and higher productivity for the decorative article 1A.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Second Embodiment

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Next, a decorative article 1B in accordance with a second preferred embodiment of the present invention and a manufacturing method thereof will be described.

Figure 3:
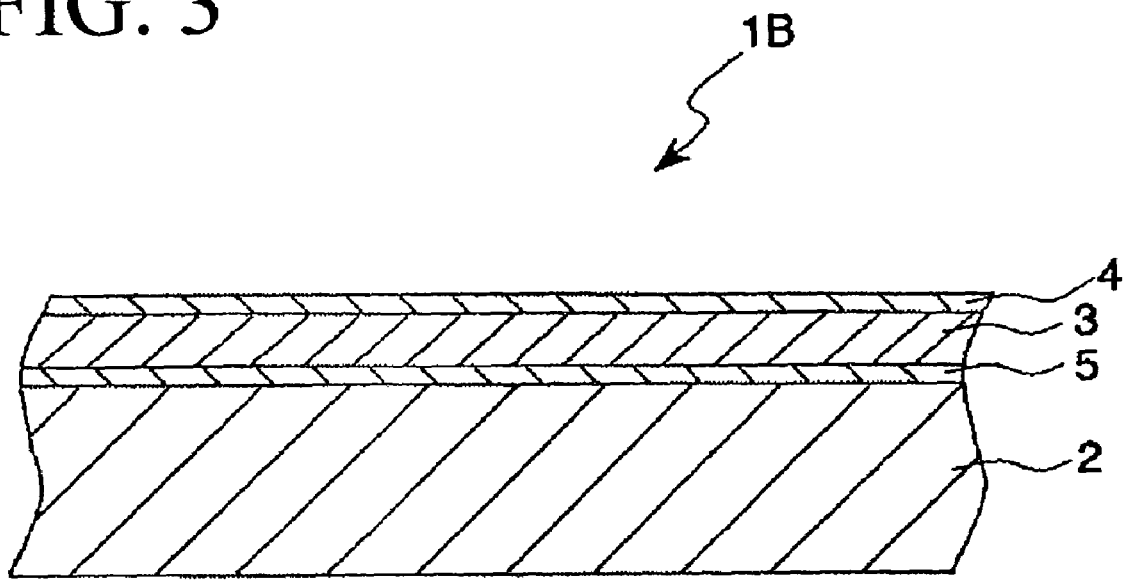
FIG. 3 is a cross-sectional view illustrating a decorative article in accordance with a second preferred embodiment of the present invention.
Figure 4:
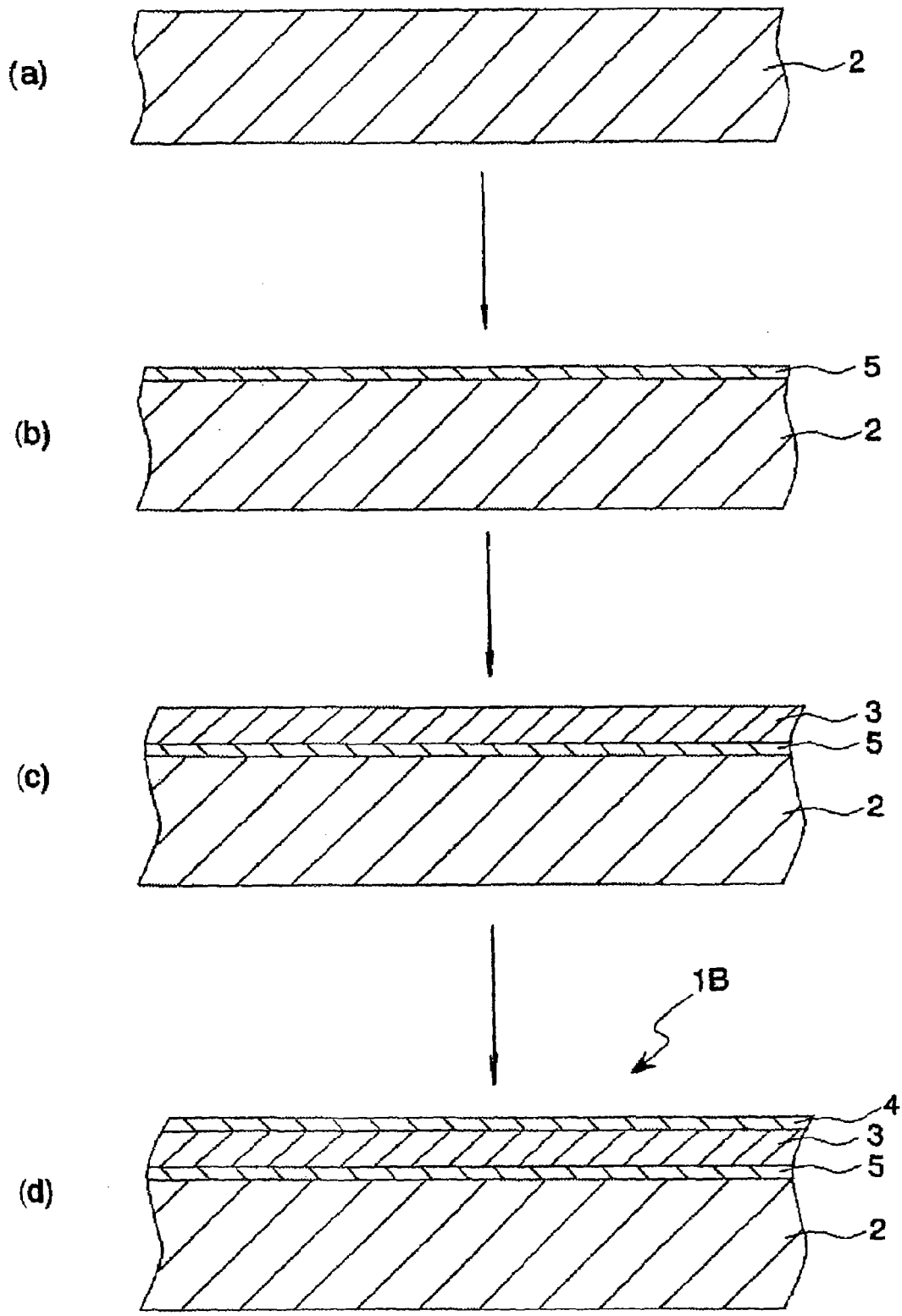
FIG. 4 is a cross-sectional view illustrating a method for manufacturing the decorative article shown in FIG. 3.

FIG. 3 is a cross-sectional view showing the second embodiment of the decorative article 1B in accordance with the second embodiment of the present invention, and FIG. 4 is a cross-sectional view showing the method for manufacturing the decorative article 1B shown in FIG. 3.

The description of the decorative article of the second embodiment and the manufacturing method thereof will focus on the differences with the embodiment previously described, and descriptions of similar matters will be omitted.

As shown in FIG. 3, the decorative article 1B of the present embodiment has a substrate 2, an underlayer 5 provided on the surface of the substrate 2, a first coat 3 provided on the surface of the underlayer 5, and a second coat 4 provided on the surface of the first coat 3. Specifically, other than having an underlayer 5 between the substrate 2 and the first coat 3, the decorative article 1B is substantially identical to the decorative article 1A previously described. Therefore, the underlayer 5 is described below.

Underlayer

The underlayer 5 may have, for example, any of the following functions: a function of improving adhesiveness between the substrate 2 and the first coat 3 (a function as an adhesiveness improving layer), a function of repairing scratches in the substrate 2 by leveling (smoothing) (a function as a leveling layer), a function of dampening impact from external forces on the resulting decorative article (a function as a cushion layer), and the like.

Possible examples of the constituent material of the underlayer 5 include Ti, Zr, Hf, V, Nb, Ta, Cr, Al, alloys containing at least one of these elements, and other such metal materials or the like. However, among these elements, Ti is preferred. If the underlayer 5 is configured primarily from Ti, for example, adhesiveness between the substrate 2 and the first coat 3 can be further improved, and the decorative article 1B can be ensured to have particularly superior reliability and durability. Further, if the underlayer 5 is configured primarily from Ti, its function as a leveling layer to alleviate irregularities in the surface of the substrate 2 is more profoundly exhibited. Moreover, if the underlayer 5 is configured primarily from Ti, the underlayer 5 functions more effectively as a cushion layer to dampen impact from external sources. As a result, the decorative article 1B is less susceptible to cuts and other such indentations.

The average thickness of the underlayer 5 is not particularly limited, but is preferably 0.1 to 2.0 μm, and is more preferably 0.5 to 1.0 μm. If the average thickness of the underlayer 5 is a value within this range, the internal stress in the underlayer 5 can be sufficiently prevented from increasing, and the functions of the underlayer 5 described above can be more effectively exhibited.

Next, the method for manufacturing the decorative article 1B described above will be described. FIG. 4 is a cross-sectional view showing a preferred embodiment of the method for manufacturing the decorative article 1B shown in FIG. 3.

As shown in FIG. 4, the method for manufacturing the decorative article of the second embodiment has a step (b) for forming the underlayer 5 on at least part of the surface of the substrate 2 (a), a first step (c) for forming the first coat 3 on at least part of the surface of the underlayer 5, and a second step (d) for forming the second coat 4 on at least part of the surface of the first coat 3. Specifically, this process is identical to that of the embodiment previously described, except that the underlayer 5 is formed prior to the formation of the first coat 3.

Underlayer Formation Step

In the present embodiment, the underlayer 5 is formed on the surface of the substrate 2 as shown in (b) of FIG. 4. The method for forming the underlayer 5 is not particularly limited, and possible examples include: spin coating, dipping, paint coating, spray coating, electrostatic coating, electrodeposition coating, and other such coating methods; electrolytic plating, immersion plating, electroless plating, and other such wet plating methods; heat CVD, plasma CVD, laser CVD, and other such chemical vapor deposition methods (CVD); vacuum deposition, sputtering, ion plating, and other such dry plating methods (vapor phase film forming methods); and thermal spraying, and the like. However, a dry plating method (vapor phase film forming method) is preferred. Applying a dry plating method (vapor phase film forming method) as the method for forming the underlayer 5 makes it possible to form reliably an underlayer 5 that has uniform thickness, is homogeneous, and has particularly superior adhesiveness with the substrate 2. As a result, the finally resulting decorative article I B can be ensured to have a particularly superior aesthetic appearance and durability. Applying a dry plating method (vapor phase film forming method) as the method for forming the underlayer 5 also makes it possible to ensure that variation in the film thickness will be sufficiently low even if the underlayer 5 to be formed is relatively thin. This is advantageous in terms of improving the reliability of the decorative article 1B.

When the first step (and second step) described above is performed with a dry plating method, for example, the underlayer formation step and the first step (and the second step) can be performed successively (without removing the substrate 2 from the apparatus) in the same apparatus by varying the type of the target and the composition of the atmospheric gas (for example, the blend ratio between Ar gas or another such inert gas as well as nitrogen gas and a hydrocarbon gas) in the vapor phase film forming apparatus (in the chamber). This results in particularly superior adhesiveness between the substrate 2, the underlayer 5, and the first coat 3 (and the second coat 4), and the productivity of the decorative article 1B is improved. Further, in particular when the underlayer 5 is configured from Ti, the underlayer 5 and the first coat 3 (and the second coat 4) can be formed successively (continuously) by varying the composition of the atmospheric gas in the vapor phase film forming apparatus (in the chamber) using the same target.

The following is a description of a timepiece of the present invention that includes the decorative article 1A or 1B of the present invention described above.

Figure 5:
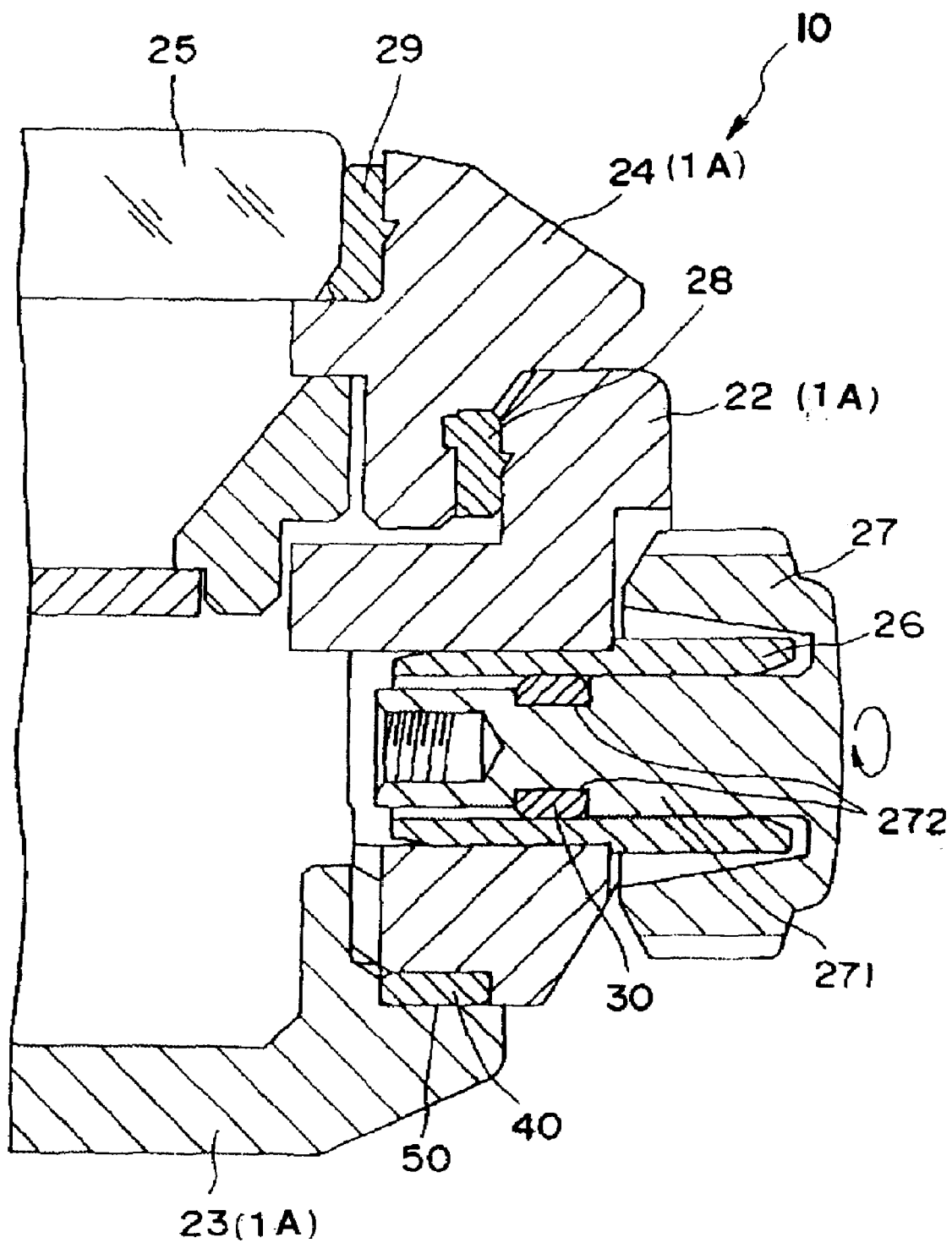
FIG. 5 is a partial cross-sectional view illustrating a timepiece (portable timepiece) having the decorative article of the present invention.

FIG. 5 is a partial cross-sectional view showing a timepiece 10 (portable timepiece) having a decorative article 1A or 1B of the present invention. A wristwatch (portable timepiece 10) of the present embodiment includes a case body (case) 22, a back cover 23, a bezel (edge) 24, and a glass plate 25. A movement (for example, a dial plate to which pointers are attached) not shown in the diagram is housed in the case 22. A stem pipe 26 is fitted and fixed in place in the case body 22, and an axle 271 of a crown 27 is rotatably inserted into the stem pipe 26. The case body 22 and the bezel 24 are fixed to each other with a plastic gasket 28, and the bezel 24 and glass plate 25 are fixed to each other with a plastic gasket 29.

The back cover 23 is fitted (or screwed) onto the case body 22. Further, a ring-shaped rubber gasket (back cover gasket) 40 is inserted through a connecting part (seal part) 50 of the back cover 23 in a compressed state. The seal part 50 is sealed in a watertight manner due to this configuration, achieving a waterproof function.

A groove 272 is formed in the outer circumference in the middle of the axle 271 of the crown 27, and a ring-shaped rubber gasket (crown gasket) 30 is fitted into the groove 272. The rubber gasket 30 is bonded to the inner peripheral surface of the stem pipe 26, and the space between the inner peripheral surface thereof and the inner peripheral surface of the groove 272 is compressed. The space between the crown 27 and the stem pipe 26 is sealed in a watertight manner due to this configuration, achieving a waterproof function. When the crown 27 is rotatably operated, the rubber gasket 30 rotates with the axle 271 and oscillates in the circumferential direction while remaining bonded to the inner peripheral surface of the stem pipe 26.

In the wristwatch 10 of the present invention, at least one decorative article (particularly an external component for a timepiece) from among the bezel 24, the case body 22, the crown 27, the back cover 23, and a timepiece band is configured from show or remove the decorative article 1A or 1B of the present invention as previously described.

The preferred embodiments of the present invention were described above, but the present invention is not limited to these embodiments.

For example, a step that can have any suitable purpose can be added as necessary to the method for manufacturing the decorative article of the present invention. For example, cleaning or another such intermediate process may be performed between the first step and the second step. Further, the substrate may be subjected to cutting, grinding, polishing, honing, or another such pretreatment.

Further, a coating layer (protective layer) to provide corrosion resistance, weather resistance, water resistance, oil resistance, scratching resistance, abrasion resistance, discoloration resistance, and the like and improving rust prevention, stain prevention, clouding prevention, scratching prevention, and other such effects may be formed on at least part of the surface of the decorative article. Such a coating layer may be designed to be removed when the decorative article is used.

Moreover, in the embodiments previously described, the first coat 3 and the second coat 4 were described as being provided adjacent to each other, but at least one middle layer may also be provided between the first coat 3 and the second coat 4. Adhesiveness between the first coat and the second coat can thereby be further improved, for example.

Working Examples

Specific working examples of the present invention will next be described.

1. Manufacture of Decorative Article

Working Example 1

A decorative article 1A (a wristwatch case (case back)) was manufactured by a method such as the one described below.

First, a substrate 2 having the shape of the wristwatch case (case back) was fabricated by casting using stainless steel (SUS 444), and the required location was then cut and polished. The substrate 2 was then cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed.

A first coat 3 primarily composed of TiCN was formed according to the method below using an ion plating apparatus on the substrate cleaned as described above.

First, while the inside of the treatment chamber of the ion plating apparatus was pre-heated, the inside of the treatment chamber was depressurized (the pressure thereof was reduced) to $2\times10^{-3}$ Pa. Nitrogen gas and acetylene gas were then respectively introduced at flow rates of 30 mL/min and 20 mL/min, and the atmospheric pressure (total pressure) inside the treatment chamber was brought to $3.0\times10^{-3}$ Pa. In such a state (as nitrogen gas and acetylene gas continued to be introduced), using Ti as a target, the ionization voltage was set to 50 V, the ionization current was set to 40 A, and vapor-phase film forming (ion plating) was performed for 60 minutes in this state (first step). As a result, a first coat 3 composed of TiCN having an average thickness of 1.6 μm was formed. The C content in the first coat 3 thus formed was 10.0 wt %, and the N content thereof was 15.0 wt %. The thickness of the first coat 3 was measured by the microscopical examination of cross sections according to JIS H 5821.

A second coat 4 primarily composed of TiCN was then formed on the surface of the first coat 3 using the above-mentioned ion plating apparatus (second step). The second coat 4 was formed according to the method described below.

After depressurizing (reducing the pressure of) the inside of the treatment chamber to $2\times10^{-3}$ Pa, nitrogen gas and acetylene gas were respectively introduced therein at flow rates of 10 mL/min and 10 mL/min, and the atmospheric pressure (total pressure) inside the treatment chamber was brought to $2.6\times10^{-3}$ Pa. In such a state (as nitrogen gas and acetylene gas continued to be introduced), using Ti as a target, the ionization voltage was set to 50 V, the ionization current was set to 40 A, and vapor-phase film forming (ion plating) was performed for 10 minutes in this state (second step). As a result, a second coat 4 composed of TiCN having an average thickness of 0.3 sum was formed. The C content in the second coat 4 thus formed was 3.0 wt %, and the N content thereof was 5.5 wt %.

The thicknesses of the first and second coats 3 and 4 were measured by the microscopical examination of cross sections according to JIS H 5821.

Working Examples 2 Through 4

Decorative articles 1A (wristwatch cases (case backs)) were manufactured by the same method as in Working Example 1, except that the average thickness of the first coat 3, and the C content and N content in the first coat 3 were set as shown in Table 1 of FIG. 6 by varying the flow rates of the nitrogen gas and acetylene gas in the first step, and by varying the treatment time in the first step. Furthermore, the average thickness of the second coat 4, and the C content and N content in the second coat were set as shown in Table 1 of FIG. 6 by varying the flow rates of the nitrogen gas and acetylene gas in the second step, and by varying the treatment time in the second step.

Working Example 5

First, a first coat 3 was formed on the surface of the substrate 2 by the same method as in Working Example 1.

A second coat 4 primarily composed of Pt was then formed on the surface of the first coat 3 using the above-mentioned ion plating apparatus. The second coat 4 was formed according to the method described below.

First, while the inside of the treatment chamber of the ion plating apparatus was pre-heated, the inside of the treatment chamber was depressurized (the pressure thereof was reduced) to $2\times10^{-3}$ Pa. Argon gas was then introduced at a flow rate of 100 mL/min, and the atmospheric pressure inside the treatment chamber was brought to $5.0\times10^{-3}$ Pa. In such a state (as argon gas continued to be introduced), using Pt as a target, the ionization voltage was set to 30 V, the ionization current was set to 25 A, and vapor-phase film forming (ion plating) was performed for 10 minutes in this state (second step). As a result, a second coat 4 composed of Pt having an average thickness of 0.3 μm was formed.

Working Example 6

A decorative article 1A (wristwatch case (case back)) was manufactured by the same method as in Working Example 5, except that the average thickness of the first coat 3, the C content and N content in the first coat 3, and the average thickness of the second coat 4 were set as shown in Table 1 of FIG. 6 by varying the flow rates of the nitrogen gas and acetylene gas in the first step, varying the treatment time in the first step, and varying the treatment time in the second step.

Working Examples 7 Through 10

Decorative articles 1A (wristwatch cases (case backs)) were manufactured by the same method as in Working Example 5, except that the average thickness of the first coat 3, the C content and N content in the first coat 3, the constituent material of the second coat 4, and the average thickness of the second coat 4 were set as shown in Table 1 of FIG. 6 by varying the flow rates of the nitrogen gas and acetylene gas in the first step, the treatment time in the first step, the composition of the target used in the second step, and the treatment time in the second step.

Working Examples 11 Through 18

Decorative articles 1A (wristwatch cases (case backs)) were manufactured by the same method as in Working Examples 3 through 10, except that a substrate 2 composed of Ti was used. A substrate 2 fabricated using the type of metal powder injection molding (MIM) described below was used.

First, Ti powder having an average particle size of 52 μm manufactured by gas atomization was prepared. A mixture of raw materials composed of 75 vol % of this Ti powder, 8 vol % of polyethylene, 7 vol % of polypropylene, and 10 vol % of paraffin wax was kneaded. A kneader was used to knead the raw materials. The temperature of the raw materials during kneading was 60° C. The kneaded mixture thus obtained was pulverized and fractionated, and pellets with an average particle size of 3 mm were obtained. Metal powder injection molding (MIM) was performed by an injection molding machine using these pellets, and a molded article having the shape of a wristwatch case was manufactured. The molded article at this time was molded with consideration for shrinkage during binder removal and sintering. The molding conditions at the time of injection molding were as follows. Die temperature: 40° C.; injection pressure: 80 kgf/cm², injection time: 20 s; cooling time: 40 s.

The binder was then removed from the molded article in a degreasing oven, and a degreased article was obtained. The binder was removed for one hour in an argon gas atmosphere at $1.0 \times 10^{-1}$ Pa and 80° C., and the temperature was then increased to 400° C. at a temperature increase rate of 10° C./hour. The weight of the sample during heat treatment was measured, and binder removal was considered to be complete at the time at which there was no more weight decrease in the sample.

Sintering was then performed using a sintering oven for the degreased article thus obtained, and a substrate 2 was obtained. Sintering was performed by heat-treating the sample for six hours at 900 to 1,100° C. in an argon gas atmosphere at a pressure of $1.3 \times 10^{-3}$ Pa to $1.3 \times 10^{-4}$ Pa.

The substrate 2 thus obtained was cleaned after being cut and polished in the necessary locations. The substrate 2 was cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed.

Working Examples 19 Through 26

Decorative articles 1B (wristwatch cases (case backs)) were manufactured by the same method as in Working Examples 3 through 10, except that an underlayer 5 was formed on the surface of the substrate 2 prior to formation of the first coat 3.

The underlayer 5 was formed as described below.

First, a substrate 2 cleaned by the same method as in Working Example 1 was placed inside the treatment chamber of an ion plating apparatus. While the inside of the treatment chamber of the ion plating apparatus was then "preheated," the treatment chamber was depressurized (the pressure thereof was reduced) to $3 \times 10^{-3}$ Pa.

Argon gas used for cleaning was then introduced into the treatment chamber, and cleaning treatment was performed for five minutes. The treatment was performed by applying a direct-current voltage of 350 V. Argon gas was then introduced into the treatment chamber, and a direct-current voltage of 400 V was applied and maintained for 30 to 60 minutes. In such a state, using Ti as a target, an underlayer composed of Ti was formed by setting the ionization voltage to 30 V, the ionization current to 20 A, and the treatment time to 20 minutes (underlayer formation step). The underlayer 5 thus formed had an average thickness of 0.5 µm.

Working Examples 27 Through 34

Decorative articles 1B (wristwatch cases (case backs)) were manufactured by the same method as in Working Examples 19 through 26, except that a substrate 2 composed of Ti was used.

A substrate 2 fabricated by the same method and conditions as those described in Working Example 3 was used.

Comparative Example 1

A decorative article (wristwatch case (case back)) was manufactured using the type of method described below.

First, a substrate 2 made of Ti was fabricated by the same method as in Working Example 11.

The substrate was then cleaned. The substrate was cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed.

A carburized layer (TiC layer) composed of TiC was formed using carburizing treatment on the substrate cleaned as described above.

Carburizing treatment was performed using the type of plasma carburizing treatment described below. Specifically, a carburizing treatment apparatus was prepared having a treatment chamber lined with graphite fibers or another thermal insulator inside a furnace and configured such that the inside of the treatment chamber was heated by heating elements composed of graphite rods, a positive electrode for a direct-current glow discharge was connected at the top inside the treatment chamber, a negative electrode was connected to the mounting platform for the treated article, and a gas manifold was disposed in a strategic location inside the treatment chamber for introducing hydrocarbon, nitrogen, argon, hydrogen, and other process gases (carburizing gases and attenuating gases) as needed.

The substrate was first placed inside the treatment chamber of the carburizing treatment apparatus, and the pressure inside the treatment chamber was reduced to $1.3 \times 10^{-3}$ Pa. With the treatment chamber in this depressurized state, the substrate was heated to approximately 300° C. using a heater.

Argon gas used for cleaning was then introduced into the treatment chamber, and cleaning treatment was performed for five minutes. The treatment was performed by applying a direct-current voltage of 350 V.

Propane gas was then introduced into the treatment chamber to bring the gas composition inside the treatment chamber to virtually 100% propane gas, and a plasma carburizing treatment was performed by setting the gas pressure to 53 Pa, applying a direct-current voltage of 400 V, and maintaining this voltage for 90 to 180 minutes. Argon gas and nitrogen gas were then injected into the treatment chamber, and the substrate was cooled to normal temperature. A carburized layer having a thickness of approximately 15 µm was formed by this type of carburizing treatment.

A second coat was then formed on the surface of the carburized layer by the same method as in Working Example 6, and a decorative article (wristwatch case (case back)) was obtained.

Comparative Example 2

A decorative article (wristwatch case (case back)) was manufactured using the type of method described below.

First, a substrate made of Ti was fabricated by the same method as in Working Example 11.

The substrate was then cleaned. The substrate was cleaned by first performing alkali electrolytic degreasing for 30 seconds, and then performing alkali immersion degreasing for 30 seconds. Neutralization for 10 seconds, water rinsing for 10 seconds, and rinsing with purified water for 10 seconds were then performed. A nitrided layer (TiN layer) composed of TiN was formed using nitriding treatment on the substrate cleaned as described above. Nitriding treatment was performed using the type of ion nitriding treatment described below.

The substrate was first placed inside the treatment chamber of the ion nitriding treatment apparatus, and the pressure inside the treatment chamber was reduced to $1.3 \times 10^{-4}$ Pa. With the treatment chamber in this depressurized state, the substrate was heated to 300° C. using a heater.

Hydrogen gas and ammonia gas were then introduced into the treatment chamber. The partial pressure of hydrogen gas inside the treatment chamber was $1.3 \times 10^{-4}$ Pa, and the partial pressure of ammonia gas therein was $1.2 \times 10^{-4}$ Pa. A direct-current voltage of 400 V was then applied, and the temperature was raised to 300° C., and while this state was maintained for 8 hours, glow discharge and nitriding treatment were performed, and a nitrided layer having a thickness of approximately 15 μm was formed.

A second coat was then formed on the surface of the nitrided layer by the same method as in Working Example 6, and a decorative article (wristwatch case (case back)) was obtained.

Comparative Example 3

First, a substrate made of stainless steel was fabricated by the same method as in Working Example 1.

A decorative article (wristwatch case (case back)) was obtained by forming a Ti layer composed of Ti on this substrate by the type of method described below. The abovementioned substrate was first cleaned by the same method as in Working Example 1, and was then placed in the treatment chamber of an ion plating apparatus.

While the inside of the treatment chamber of the ion plating apparatus was then "preheated," the treatment chamber was depressurized (the pressure thereof was reduced) to $3 \times 10^{-3}$ Pa.

Argon gas used for cleaning was then introduced into the treatment chamber, and cleaning treatment was performed for five minutes. The treatment was performed by applying a direct-current voltage of 350 V. Argon gas was then introduced into the treatment chamber, and a direct-current voltage of 400 V was applied and maintained for 30 to 60 minutes. In such a state, using Ti as a target, a Ti layer composed of Ti was formed by setting the ionization voltage to 30 V, the ionization current to 20 A, and the treatment time to 80 minutes. The Ti layer thus formed had an average thickness of 2.5 μm.

Comparative Example 4

A decorative article (wristwatch case (case back)) was obtained by the same method as in Comparative Example 3, except that a second coat was formed on the surface of the Ti layer by the same method as in Working Example 6.

Comparative Example 5

First, a substrate made of stainless steel was fabricated by the same method as in Working Example 1.

A decorative article (wristwatch case (case back)) was obtained by forming a TiCN layer (first coat) composed of TiCN on this substrate by the type of method described below.

The abovementioned substrate was first cleaned by the same method as in Working Example 1, and was then placed in the treatment chamber of an ion plating apparatus. While the inside of the treatment chamber of the ion plating apparatus was then "preheated," the treatment chamber was depressurized (the pressure thereof was reduced) to $3 \times 10^{-3}$ Pa. Argon gas used for cleaning was then introduced into the treatment chamber, and cleaning treatment was performed for five minutes. The treatment was performed by applying a direct-current voltage of 350 V.

After the inside of the treatment chamber was depressurized (the pressure thereof was reduced) to $2 \times 10^{-3}$ Pa, nitrogen gas and acetylene gas were respectively introduced at flow rates of 90 mL/min and 20 mL/min, and the atmospheric pressure (total pressure) inside the treatment chamber was brought to $5.0 \times 10^{-3}$ Pa. In such a state (as nitrogen gas and acetylene gas continued to be introduced), using Ti as a target, the ionization voltage was set to 32 V, the ionization current was set to 16 A, and vapor-phase film forming (ion plating) was performed for 35 minutes in this state. As a result, a TiCN layer (first coat) composed of TiCN having an average thickness of 0.8 μm was formed. The C content in the TiCN layer (first coat) thus formed was 25.0 wt %, and the N content thereof was 6.0 wt %. The thickness of the TiCN layer (first coat) was measured by the microscopical examination of cross sections according to JIS H 5821.

Comparative Example 6

A decorative article (wristwatch case (case back)) was obtained by the same method as in Comparative Example 5, except that a second coat was formed on the surface of the TiCN layer by the same method as in Working Example 6.

Comparative Example 7

A decorative article (wristwatch case (case back)) was obtained by the same method as in Working Example 4, except that a second coat was not formed on the surface of the first coat.

Comparative Example 8

A decorative article (wristwatch case (case back)) was obtained by the same method as in Working Example 6, except that the first step was performed without using nitrogen gas.

Comparative Example 9

A decorative article (wristwatch case (case back)) was obtained by the same method as in Working Example 6, except that the first step was performed without using acetylene gas.

The configurations of the decorative articles in the working examples and comparative examples are shown together in Tables 1, 2, and 3. In Tables 1 through 3, stainless steel is indicated by the symbol "SUS." In Table 3, the values relating to the carburized layer and nitrided layer formed by carburizing treatment and nitriding treatment in Comparative Examples 1 and 2, respectively, are shown in the column labeled "First Coat." In Table 3 of FIG. 8, the values relating to the Ti layer in Comparative Examples 3 and 4 are shown in the column labeled "First Coat." The second coat in the working examples and comparative examples had a purity of 99.9 wt % or above, and was composed of the materials shown in Tables 1 through 3 of FIGS. 6 to 8, respectively.

2. Appearance Evaluation

The decorative articles manufactured in Working Examples 1 to 34 and Comparative Examples 1 to 9 were observed with the naked eye and with a microscope, and these appearances were evaluated according to the following four standards, which are listed in order of preference.

: excellent appearance
o: good appearance
Δ: fair appearance
X: poor appearance

3. Abrasion Resistance Evaluation

The decorative articles manufactured in Working Examples 1 to 34 and Comparative Examples 1 to 9 were subjected to the tests shown below, and their abrasion resistance was evaluated.

Using a Suga abrasion test instrument (NUS-ISO-1) made by Suga Test Instruments, the surfaces on the side of the decorative articles on which the coats were formed (the surfaces opposite the exposed surface of the substrate) were subjected to abrasion with a total of 200 DS (double strokes) under a load of 400 gf, and the appearances of the decorative articles were then observed with the naked eye and evaluated according to the following four standards. The tests were conducted using a wrapping film (aluminum oxide, particle size: 30 μm) made by Sumitomo 3M (Co.). Following is a list in order of preference.

: no cuts observed in the surface of the coat
o: few cuts observed in the surface of the coat
Δ: fair amount of cuts observed in the surface of the coat
X: numerous cuts observed in the surface of the coat 4. Scratching Resistance (Resistance to Scratches) Evaluation The decorative articles manufactured in Working Examples 1 to 34 and Comparative Examples 1 to 9 were evaluated for cutting resistance by conducting the tests shown below.

A stainless steel ball (1 cm in diameter) was dropped from a height of 50 cm onto the surfaces of the decorative articles on the side on which the coat was formed, and the size of the indentations (diameter of the indentations) in the decorative article surfaces were measured and evaluated according to the following four standards, which are listed in order of preference.

: diameter of indentation was less than 1 mm, or no indentation was observed
o: diameter of indentation was 1 mm or greater and less than 2 mm
Δ: diameter of indentation was 2 mm or greater and less than 3 mm
X: diameter of indentation was 3 mm or greater 5. Removal of Coat With Reagents and Re-forming of Coat In the decorative articles manufactured in the Working Examples and Comparative Examples, the coats were removed with reagents, and the coats were re-formed under conditions similar to those in the corresponding Working Examples and Comparative Examples. The ease of removing the coats (first coat and second coat) and re-forming the coats were evaluated according to the following four standards, which are listed in order of preference.

: The coats could be easily and reliably removed with reagents and re-formed, and the appearance of the decorative article on which the coats were re-formed was similar to that of the coats that were removed with reagents.
o: Removing the coats with reagents and re-forming the coats were somewhat difficult, but the appearance of the decorative article on which the coats were re-formed was substantially similar to that of the coats that were removed with reagents. Alternatively, removing the coats with reagents and re-forming the coats were easy, but the appearance of the decorative article on which the coats were re-formed was somewhat inferior to that of the coats that were removed with reagents.
Δ: Removing the coats with reagents and re-forming the coats were somewhat difficult, and the appearance of the decorative article on which the coats were re-formed was somewhat inferior to that of the coats that were removed with reagents.
X: Removing the coats with reagents and re-forming the coats were substantially impossible, and/or the appearance of the decorative article on which the coats were re-formed was drastically inferior to that of the coats that were removed with reagents.

For the method of removing the coats, an aqueous solution containing 15 vol % of nitric acid ($HNO_3$) and 15 vol % of sulfuric acid ($H_2SO_4$) was used as the chemical, and the decorative articles were immersed in this aqueous solution.

For the decorative articles wherein the coats could not be removed by reagents, an attempt was made to remove the coats by grinding, polishing, or another such mechanical method. As a result, although the coats could be removed, the substrate was scratched. Then, when the coats were re-formed under the same conditions on the decorative articles from which the coats had been removed, the aesthetic appearance of the resulting decorative articles was drastically reduced due to the effects of the scratches on the substrate.

These results are shown in Tables 4 and 5 of FIGS. 9 and 10, respectively, along with the Vickers hardness Hv of the coats. The Vickers hardness Hv denotes a value measured under a load of 10 gf in the surfaces of the decorative articles (the surfaces of the side to which the second coats were provided).

As is made clear from Tables 4 and 5 of FIGS. 9 and 10, respectively, the decorative articles of the present invention all had superior aesthetic appearances. Further, the decorative articles of the present invention had high hardness and superior abrasion resistance and scratching resistance. Moreover, those wherein the C and N content in the first coat and the thickness of the coats (first coat, second coat, underlayer) were values within the preferred ranges had particularly superior results. As seen in FIGS. 6, 9, and 10, the best results with regards to Vickers Hardness, Appearance Evaluation, Abrasion Resistance. Scratching Resistance, and Film Coating Re-forming came when the C and N content were between 19.5 and 30 wt %, and more specifically between 19.5 and 25 wt %. Even further, the decorative articles of the present invention were free of flashiness and had a superior feel.

In the present invention, coats (first coat, second coat, underlayer) with the desired compositions and characteristics could be easily formed by appropriately selecting the atmospheric components during ion plating.

The decorative articles of the present invention had superior durability, the coats could be easily and reliably removed by using special reagents, and the coats could be suitably re-formed.

Accordingly, satisfactory results were not obtained in the Comparative Examples. Particularly, the decorative articles of Comparative Examples 1 and 2 had significant surface roughness during the formation of the carburizing layer and nitriding layer, and the decorative articles covered by the second coats (Pt layers) were significantly inferior in appearance. The decorative articles of Comparative Examples 3 through 7 also were inferior in appearance, and lacked a sense of sophistication. From among these, the decorative articles of Comparative Examples 5, 6, and 8, wherein the C content in the first coat was high, had a strong black appearance. In addition, particularly in the decorative articles of Comparative Examples 6 and 8, the color of the first coat had an adverse effect on the appearance of the decorative article regardless of whether the second coat covered the surface of the first coat. The evaluations of abrasion resistance and scratching resistance were particularly low for the decorative articles of Comparative Examples 3 through 6, 8, and 9. The reason for this is believed to be that the first coats (the Ti layers for the first coats in Comparative Examples 3 and 4) had a low Vickers hardness. From among these, the reason that the decorative articles of Comparative Examples 5 and 6 had a low Vickers hardness, measured as described above, regardless of the large combined C content and N content in the first coat is believed to be because the thickness of the first coat was low. In view of this, when an attempt was made to manufacture a decorative article with a configuration similar to Comparative Examples 5 and 6, with the main difference being that the time for forming the first coat was varied and the thickness of the first coat was greater, a large crack formed in the first coat at the point where the thickness of the first coat reached about 1.5 μm during film formation. As a result, the decorative article manufactured by such a method had a significantly inferior appearance. Further, in the decorative articles of Comparative Examples 1 through 6, 8, and 9, the coats could not be satisfactorily removed and re-formed, and it was substantially impossible to remove and re-form the coats, particularly in the decorative articles of Comparative Examples 1 through 4, and 8. As described above, it was difficult to apply the decorative articles of the Comparative Examples to external components for timepieces, which must have the characteristics of decorative articles and the characteristics of practical articles.

Wristwatches such as the one shown in FIG. 5 were assembled using the decorative articles manufactured in the Working Examples and Comparative Examples. Results similar to those described above were obtained when these wristwatches were subjected to evaluations similar to the foregoing.

The term "configured" as used herein to describe a component, section or part of a device includes hardware and/or software that is constructed and/or programmed to carry out the desired function.

Moreover, terms that are expressed as "means-plus-function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-075184. The entire disclosure of Japanese Patent Application No. 2004-075184 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A decorative article comprising:
   a substrate having a surface vicinity at least part thereof being primarily configured from one of the group consisting of Ti, stainless steel, and Ti and stainless steel;
   a first coat being formed on said substrate and being primarily configured from TiCN, a combined C content and N content in said first coat being 19.5 to 30 wt %; and
   a second coat being formed on a side of said first coat opposite a side facing said substrate, and M being 90 wt % or more of said second coat, M being one or more elements selected from the group consisting of Ti, Pt, Pd, and In.

2. The decorative article according to claim 1, wherein said C content in said first coat is 3 to 12 wt %.

3. The decorative article according to claim 1, wherein said N content in said first coat is 2 to 18 wt %.

4. The decorative article according to claim 1, wherein said C content in said first coat is less than said N content in said first coat.

5. The decorative article according to claim 1, wherein an average thickness of said first coat is 1.6 to 5 μm.

6. The decorative article according to claim 1, wherein an average thickness of said second coat is 0.15 to 0.5 μm.

7. The decorative article according to claim 1, wherein said first coat is formed by a vapor phase film forming method.

8. The decorative article according to claim 7, wherein said vapor phase film forming method is ion plating.

9. The decorative article according to claim 1, wherein said second coat is formed by ion plating.

10. The decorative article according to claim 1, having at least one underlayer between said substrate and said first coat.

11. The decorative article according to claim 10, having a layer configured primarily from Ti as said underlayer.

12. The decorative article according to claim 10, wherein an average thickness of said underlayer is 0.1 to 2.0 μm.

13. The decorative article according to claim 1, wherein a Vickers hardness Hv measured at a load of 10 gf is 600 to 1000 on a surface of a side on which said second coat is provided.

14. The decorative article according to claim 1, wherein said decorative article is an exterior component for a timepiece.

15. A timepiece having the decorative article according to claim 1.

16. The decorative article according to claim 1, wherein the combined C content and N content in said first coat is 19.5 to 25 wt %.

17. A decorative article comprising:
   a substrate having a surface vicinity at least part thereof being primarily configured from one of the group consisting of Ti, stainless steel, and Ti and stainless steel;
   a first coat being formed on said substrate and being primarily configured from TiCN, a combined C content and N content in said first coat being 5 to 30 wt %; and
   a second coat being formed on a side of said first coat opposite a side facing said substrate, and being primarily configured from TiCN, a combined C content and N content in said second coat being less than a combined C content and N content in said first coat.

18. The decorative article according to claim 17, wherein said combined C content and N content in said second coat is 2 to 10 wt %.

19. The decorative article according to claims 17, wherein said C content in said first coat is 3 to 12 wt %.

20. The decorative article according to claim 17, wherein said N content in said first coat is 2 to 18 wt %.

21. The decorative article according to claim 17, wherein said C content in said first coat is less than said N content in said first coat.

22. The decorative article according to claim 17, wherein an average thickness of said first coat is 1.6 to 5 μm.

23. The decorative article according to claim 17, wherein an average thickness of said second coat is 0.15 to 0.5 μm.

24. The decorative article according to claim 17, wherein said first coat is formed by a vapor phase film forming method.

25. The decorative article according to claim 24, wherein said vapor phase film forming method is ion plating.

26. The decorative article according to claim 17, wherein said second coat is formed by ion plating.

27. The decorative article according to claim 17, having at least one underlayer between said substrate and said first coat.

28. The decorative article according to claim 27, having a layer configured primarily from Ti as said underlayer.

29. The decorative article according to claim 27, wherein an average thickness of said underlayer is 0.1 to 2.0 μm.

30. The decorative article according to claim 17, wherein a Vickers hardness Hv measured at a load of 10 gf is 600 to 1000 on a surface of a side on which said second coat is provided.

31. The decorative article according to claim 17, wherein said decorative article is an exterior component for a timepiece.

32. A timepiece having said decorative article according to claims 17.

* * * * *